(12) United States Patent
Leipold et al.

(10) Patent No.: US 9,870,855 B2
(45) Date of Patent: *Jan. 16, 2018

(54) MULTIPLEXERS USING WEAKLY-COUPLED NETWORKS IN RF FRONT END CIRCUITRY

(71) Applicant: Qorvo US, Inc., Greensboro, NC (US)

(72) Inventors: Dirk Robert Walter Leipold, San Jose, CA (US); George Maxim, Saratoga, CA (US); Marcus Granger-Jones, Scotts Valley, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 237 days.

This patent is subject to a terminal disclaimer.

(21) Appl. No.: 14/927,565

(22) Filed: Oct. 30, 2015

(65) Prior Publication Data

US 2016/0127063 A1 May 5, 2016

Related U.S. Application Data

(60) Provisional application No. 62/074,420, filed on Nov. 3, 2014.

(51) Int. Cl.
*H01F 27/28* (2006.01)
*H03H 7/38* (2006.01)
(Continued)

(52) U.S. Cl.
CPC ........... *H01F 27/2804* (2013.01); *H03H 7/38* (2013.01); *H03H 7/463* (2013.01); *H04B 1/40* (2013.01);
(Continued)

(58) Field of Classification Search
CPC ........ H01F 27/2804; H01F 2027/2809; H03H 7/38; H03H 7/463; H04B 1/40;
(Continued)

(56) References Cited

U.S. PATENT DOCUMENTS

| 6,226,275 B1 * | 5/2001 | Yang | ......................... H04B 1/44 |
| | | | 370/280 |
| 7,733,814 B1 * | 6/2010 | Rausch | ................ H04B 1/0057 |
| | | | 333/1.1 |

(Continued)

*Primary Examiner* — Ricky Ngo
*Assistant Examiner* — Brian T Le
(74) *Attorney, Agent, or Firm* — Withrow & Terranova P.L.L.C.

(57) ABSTRACT

Multiplexing circuitry is disclosed that includes filtering circuitry, which provides a first transfer function between a common port and a first port and a second transfer function between the common port and a second port. The first transfer function and second transfer function provide a first passband and a second passband, respectively. The first transfer function also has a stopband provided within the second passband of the second transfer function because the filtering circuitry includes a first filter path and a second filter path, wherein the second filter path has a first and second parallel resonant circuit provided in shunt with respect to the second filter path and weakly coupled to one another. The weak coupling between the first parallel resonant circuit and the second parallel resonant circuit naturally provides the stopband in the first transfer function within the second passband of the second transfer function.

20 Claims, 24 Drawing Sheets

(51) Int. Cl.
*H03H 7/46* (2006.01)
*H04B 1/40* (2015.01)
*H04J 1/08* (2006.01)

(52) U.S. Cl.
CPC ........ *H04J 1/08* (2013.01); *H01F 2027/2809* (2013.01)

(58) Field of Classification Search
CPC .......... H04B 1/525; H04J 1/08; H03M 3/468; H03M 3/436; G01H 1/003; G02B 6/12007
See application file for complete search history.

(56) References Cited

U.S. PATENT DOCUMENTS

| | | |
|---|---|---|
| 9,196,406 B2 | 11/2015 | Leipold et al. |
| 2013/0250819 A1 | 9/2013 | Khlat et al. |
| 2014/0266531 A1 | 9/2014 | Leipold et al. |
| 2015/0035637 A1 | 2/2015 | Maxim et al. |

\* cited by examiner

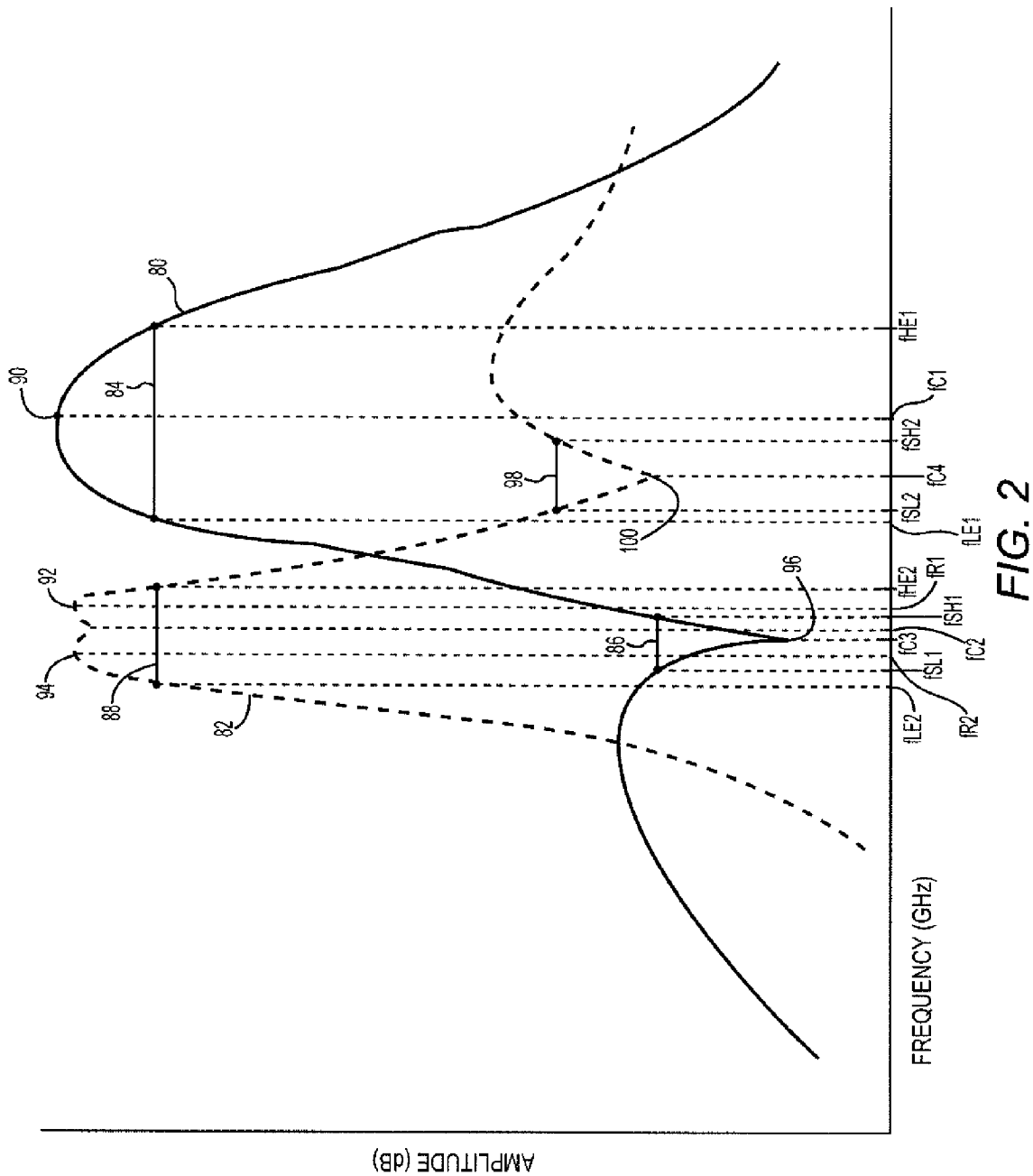

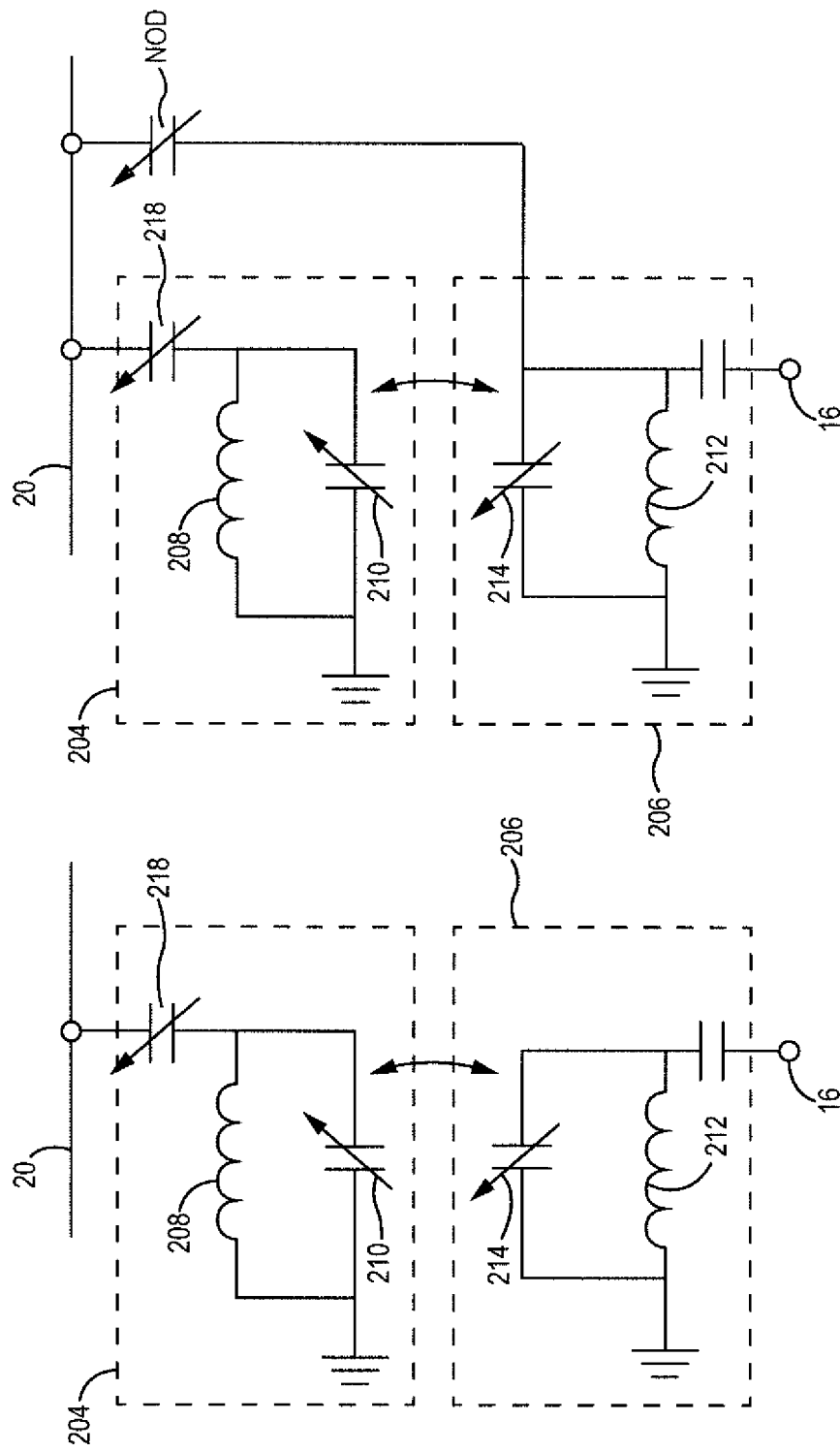

MULTIPLEXERS USING WEAKLY-COUPLED NETWORKS IN RF FRONT END CIRCUITRY

RELATED APPLICATIONS

This application claims the benefit of provisional patent application Ser. No. 62/074,420, filed Nov. 3, 2014, the disclosure of which is hereby incorporated herein by reference in its entirety.

The present application is related to concurrently filed U.S. patent application Ser. No. 14/927,546, entitled "MULTIPLEXERS USING WEAKLY-COUPLED NETWORKS IN RF FRONT END CIRCUITRY;" the disclosure of which is hereby incorporated herein by reference in its entirety.

FIELD OF THE DISCLOSURE

This disclosure relates generally to Radio Frequency (RF) front end circuitry.

BACKGROUND

Multiplexers are provided in Radio Frequency (RF) front end circuitry in order to route RF signal through the front end circuitry to the appropriate circuit component. For example, multiplexers may be utilized to route RF signals from different transceiver chains to an antenna or from the antenna to the designated transceiver chain. Some multiplexing circuitry uses filtering to route RF signals within different RF communication bands to the appropriate circuit components provided by the RF front end circuitry. Unfortunately, paths within the multiplexer having filtering components for a particular RF communication band that pass RF signals within a particular RF communication band can load the other paths provided by the multiplexing circuitry. One solution to this problem, which is only partially worked, is to provide additional filtering components within each path that block the RF communication bands of the other paths for the other RF communication bands provided by the multiplexer. Not only has this approach only had partial success, but as the number of paths and the number of different RF communication bands that can be handled by the multiplexer increases, so does the number of filtering components required to filter out noise and prevent insertion losses from the other paths. In other words, as the number of paths for different RF frequency bands grows, each path should include filtering components (e.g., notch filters) for every other path provided by the multiplexer. Accordingly, as the degree of multiplexing increases with the multiplexer, so does the amount of filtering components required by each path in order to prevent or at least reduce insertion losses and noise from the other paths. Thus what is needed is a more efficient technique for reducing insertion losses and blocking noise in paths for different RF communication bands within the multiplexer.

SUMMARY

This disclosure relates generally to multiplexing circuitry and methods of operating the same. In one embodiment, the multiplexing circuitry includes a common port, a first Radio Frequency (RF) port, a second RF port, and filtering circuitry coupled to the common port, the first RF port, and the second RF port. The filtering circuitry is configured to provide a first transfer function between the common port and the first RF port and a second transfer function between the common port and the second RF port. More specifically, the filtering circuitry includes a first filter path connected between the common port and the first RF port and a second filter path connected to the second RF port. The first transfer function provided by the filtering circuitry has a first passband, while the second transfer function has a second passband. A first parallel resonant circuit is provided in shunt with respect to the second filter path and a second parallel resonant circuit is also provided in shunt with respect to the second filter path. The second parallel resonant circuit is weakly coupled to the first parallel resonant circuit. In this manner, the first transfer function also has a first stopband that is within the second passband provided by the second transfer function. Accordingly, the weak coupling between the first parallel resonant circuit and the second parallel resonant circuit naturally creates the first stopband in the first frequency response within the second passband of the second frequency response. In this manner, additional filtering components are not required in the first filter path in order to block noise and reduce insertion losses resulting from the second filter path.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 2 illustrates a frequency response of the multiplexing circuitry shown in FIG. 1 where a first transfer function has a first passband and a second transfer function has a second passband, wherein the first transfer function also includes a stopband within the second passband of the second transfer function.

Figure 8:
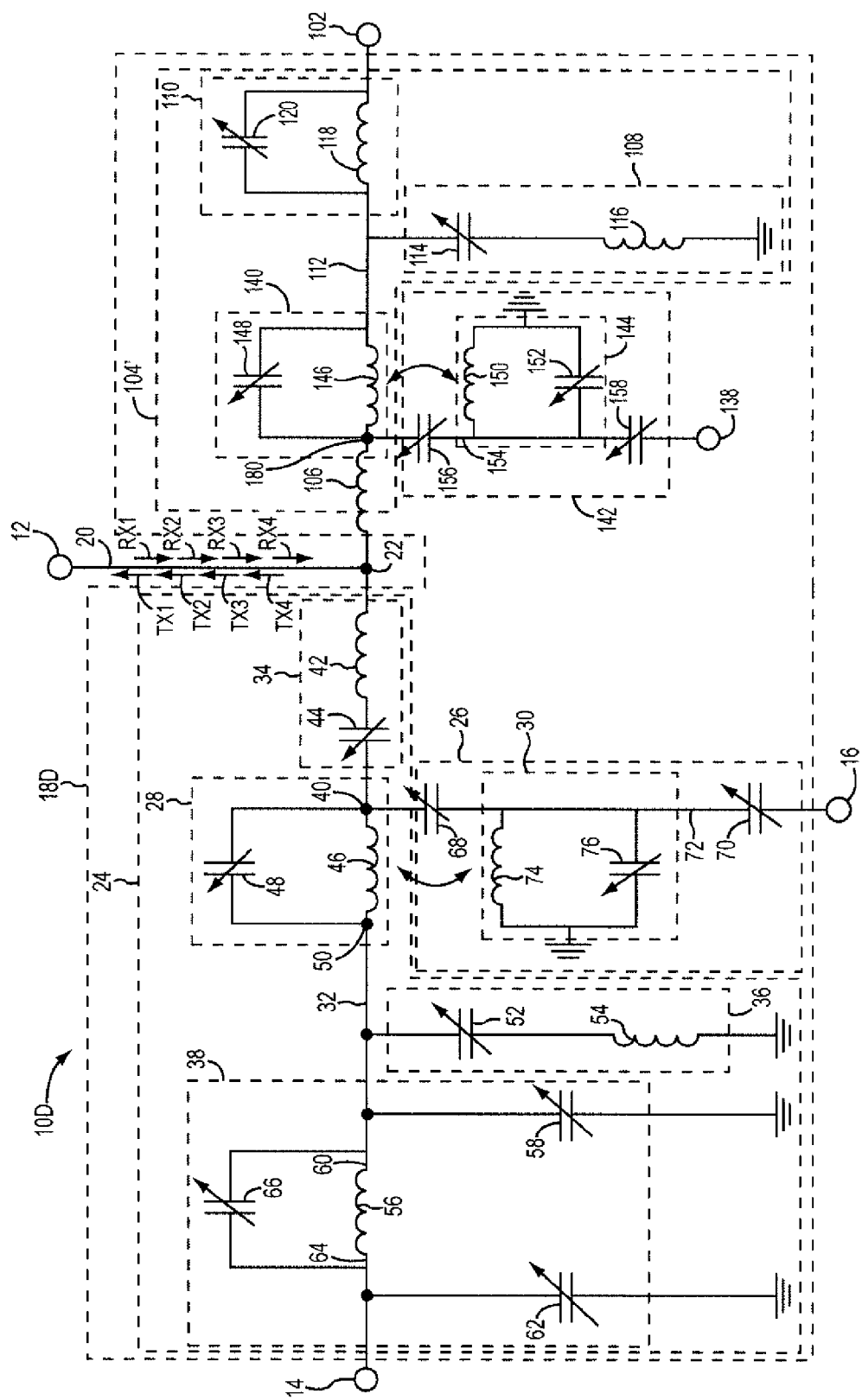

FIG. 8 illustrates yet another embodiment of multiplexing circuitry that includes the first filter path, the second filter path, the third filter path with a parallel resonant circuit connected in series, and a fourth filter path with a parallel resonant circuit connected in shunt wherein the parallel resonant circuits of the third filter path and the fourth filter path are weakly coupled to one another.

Figure 9:
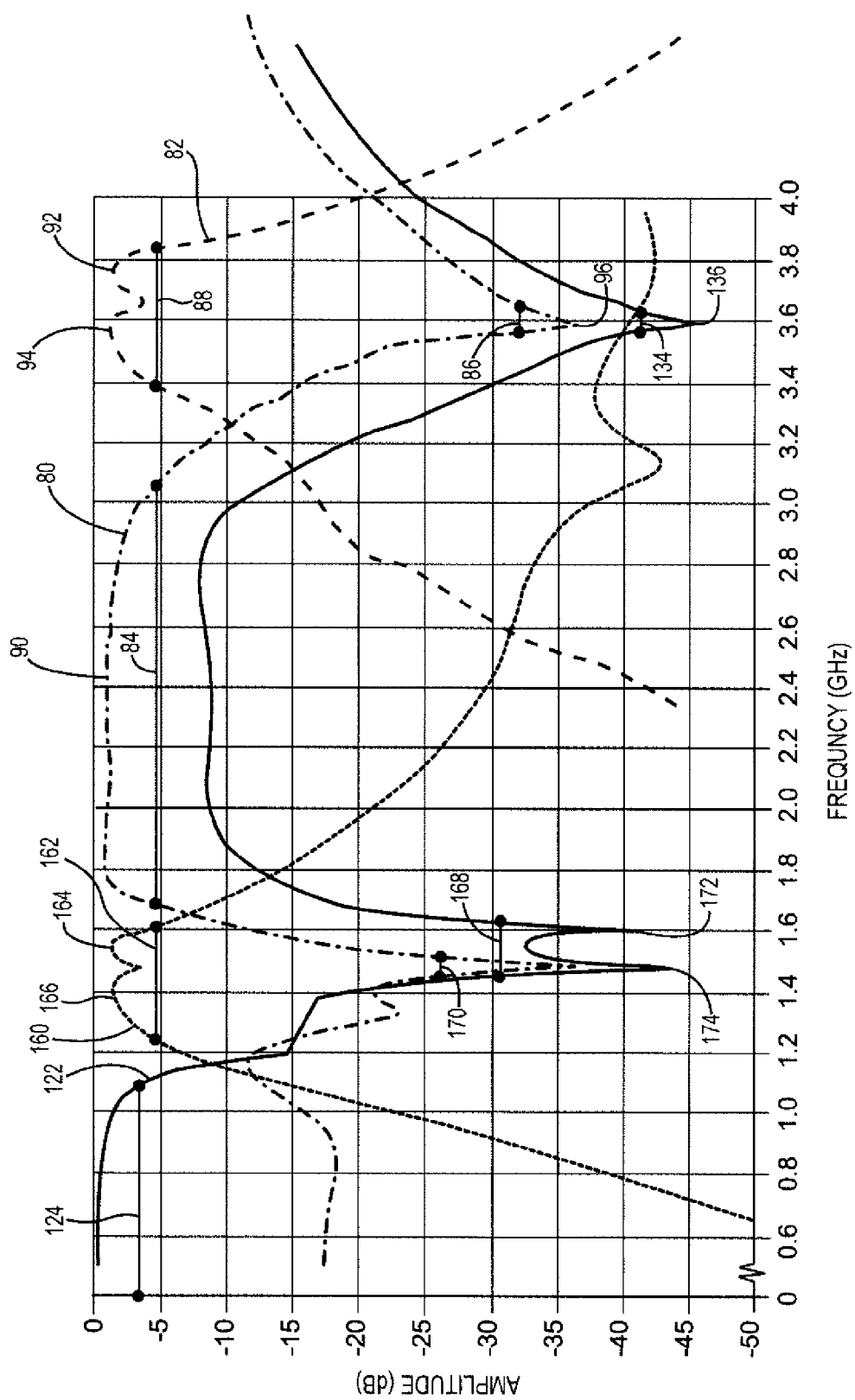

FIG. 9 illustrates a frequency response of the multiplexing circuitry shown in FIG. 8.

Figure 10:
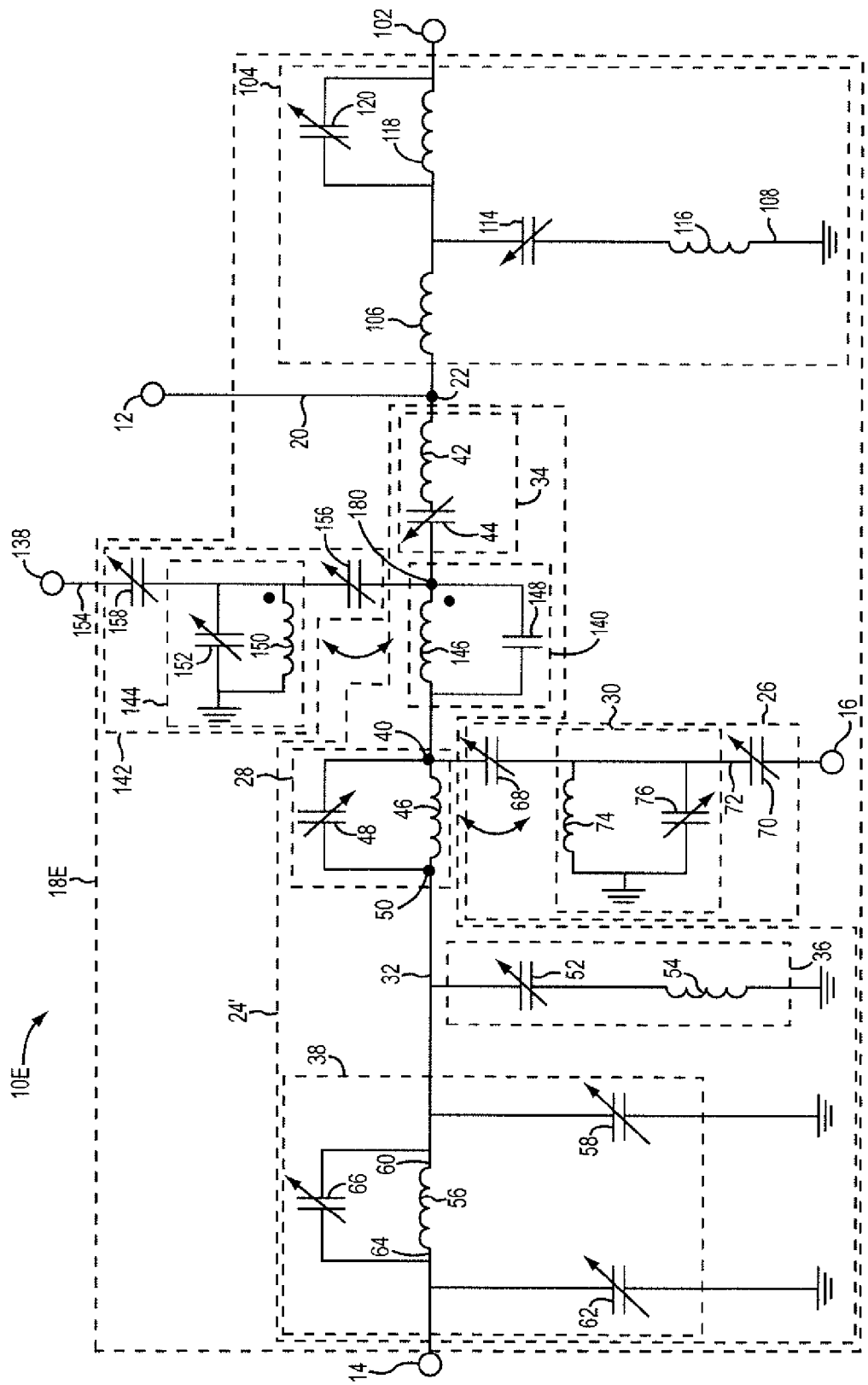

FIG. 10 illustrates yet another embodiment of multiplexing circuitry that includes still another parallel resonant circuit connected in series, the second filter path, the third filter path, and a fourth filter path with a parallel resonant circuit connected in shunt, wherein the parallel resonant circuits of the first filter path and the fourth filter path are weakly coupled to each other.

Figure 11:
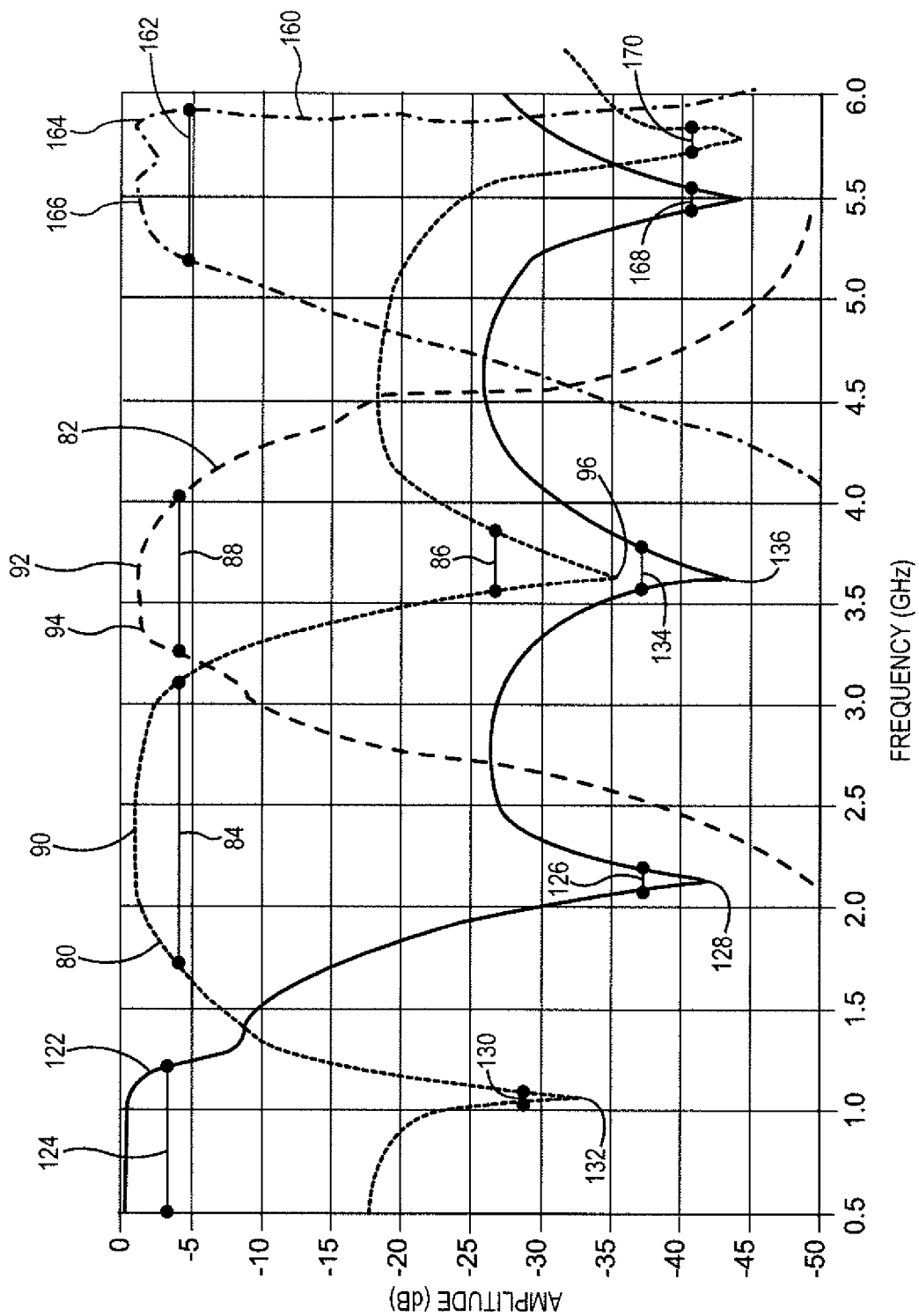

FIG. 11 illustrates a frequency response of the multiplexing circuitry shown in FIG. 10.

Figure 12:
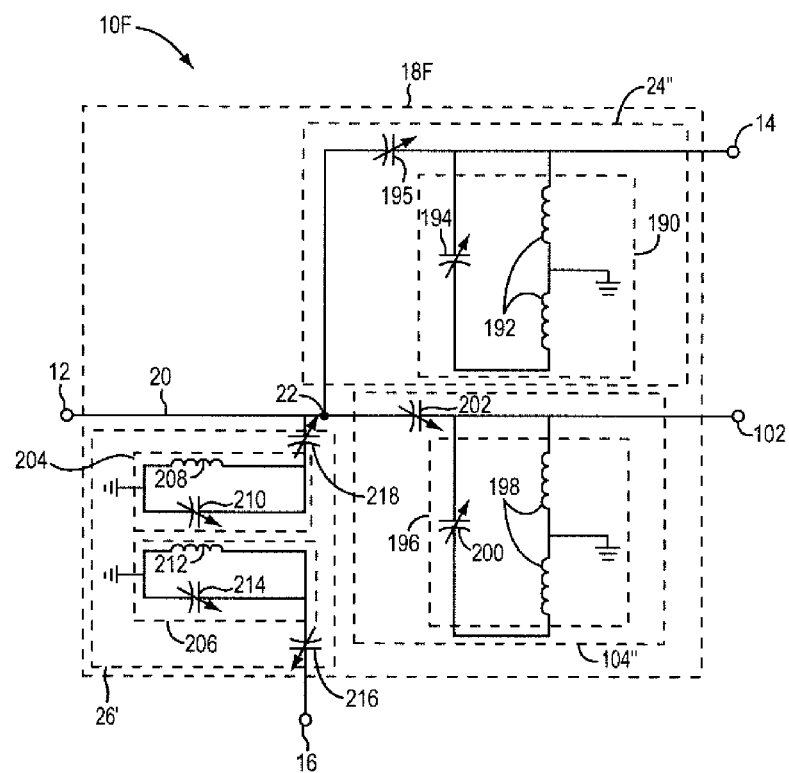

FIG. 12 illustrates still another embodiment of multiplexing circuitry having the first filter path, the second filter path, and the third filter path, wherein the second filter path includes a pair of weakly coupled parallel resonant circuits that are each coupled in shunt with respect to the second filter path.

Figure 13:
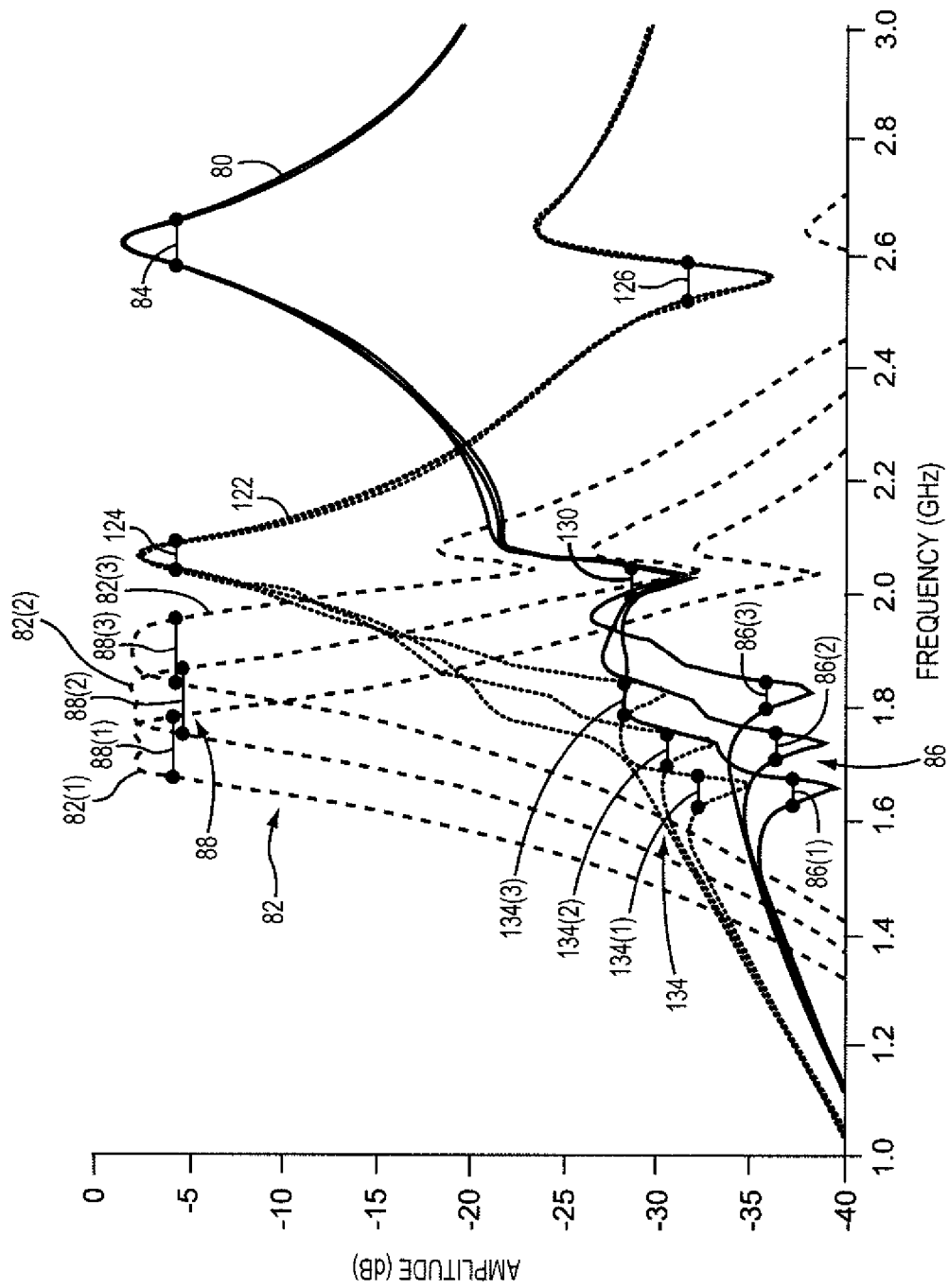

FIG. 13 illustrates a frequency response of the multiplexing circuitry shown in FIG. 12.

Figure 13C:
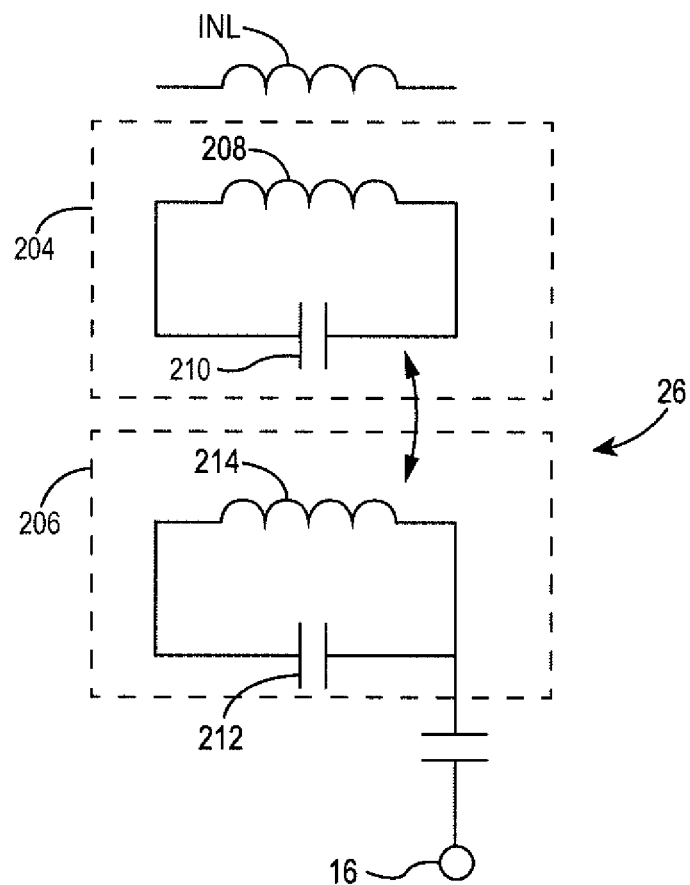

FIGS. 13A-13C illustrate different implementations for coupling the second filter path in FIG. 12 to another path.

Figure 1:
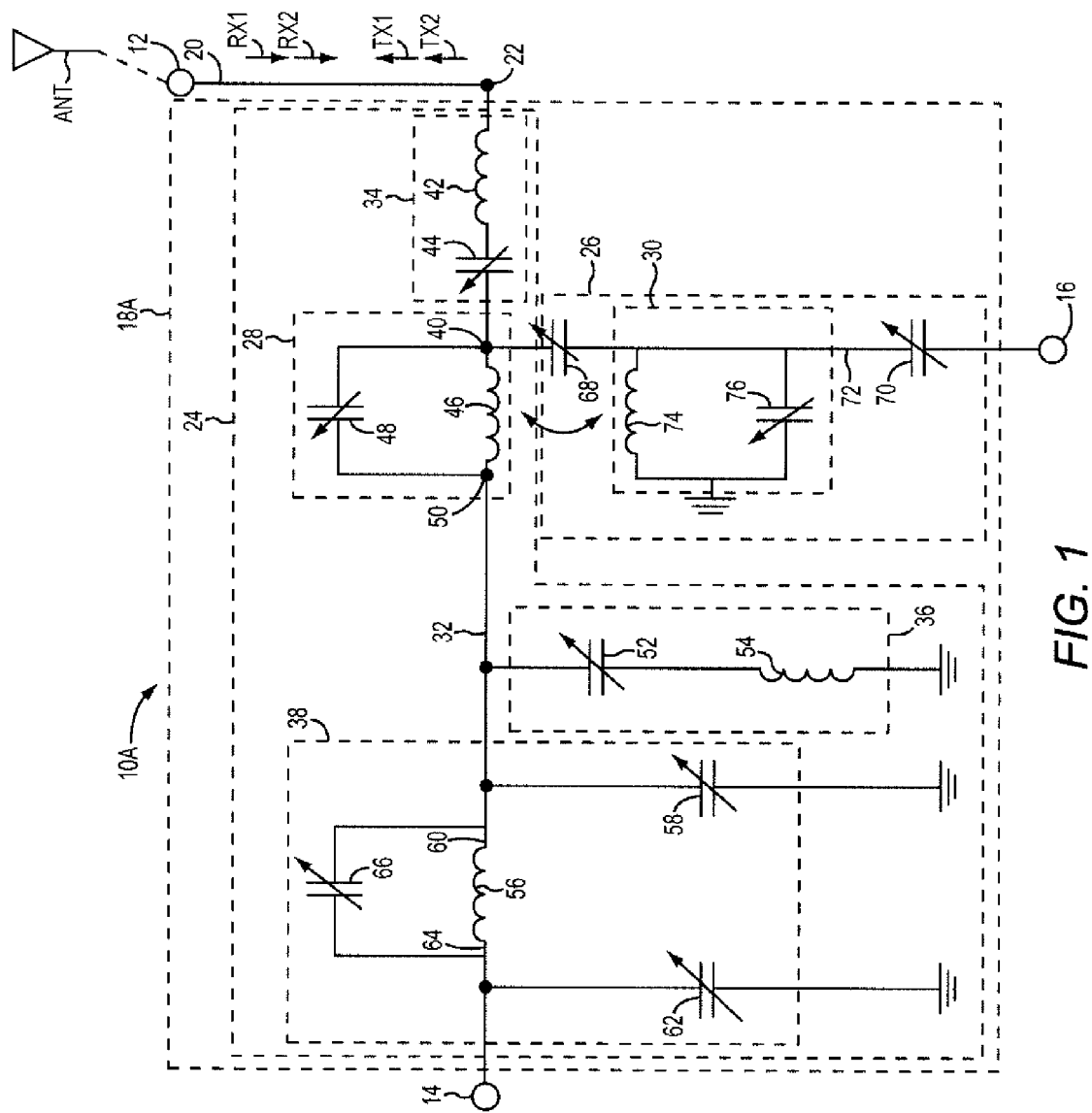
FIG. 1 illustrates one embodiment of multiplexing circuitry having a first filter path with a parallel resonant circuit connected in series and a second filter path with a parallel resonant circuit coupled in shunt wherein the parallel resonant circuits are weakly coupled to each other.
Figure 4:
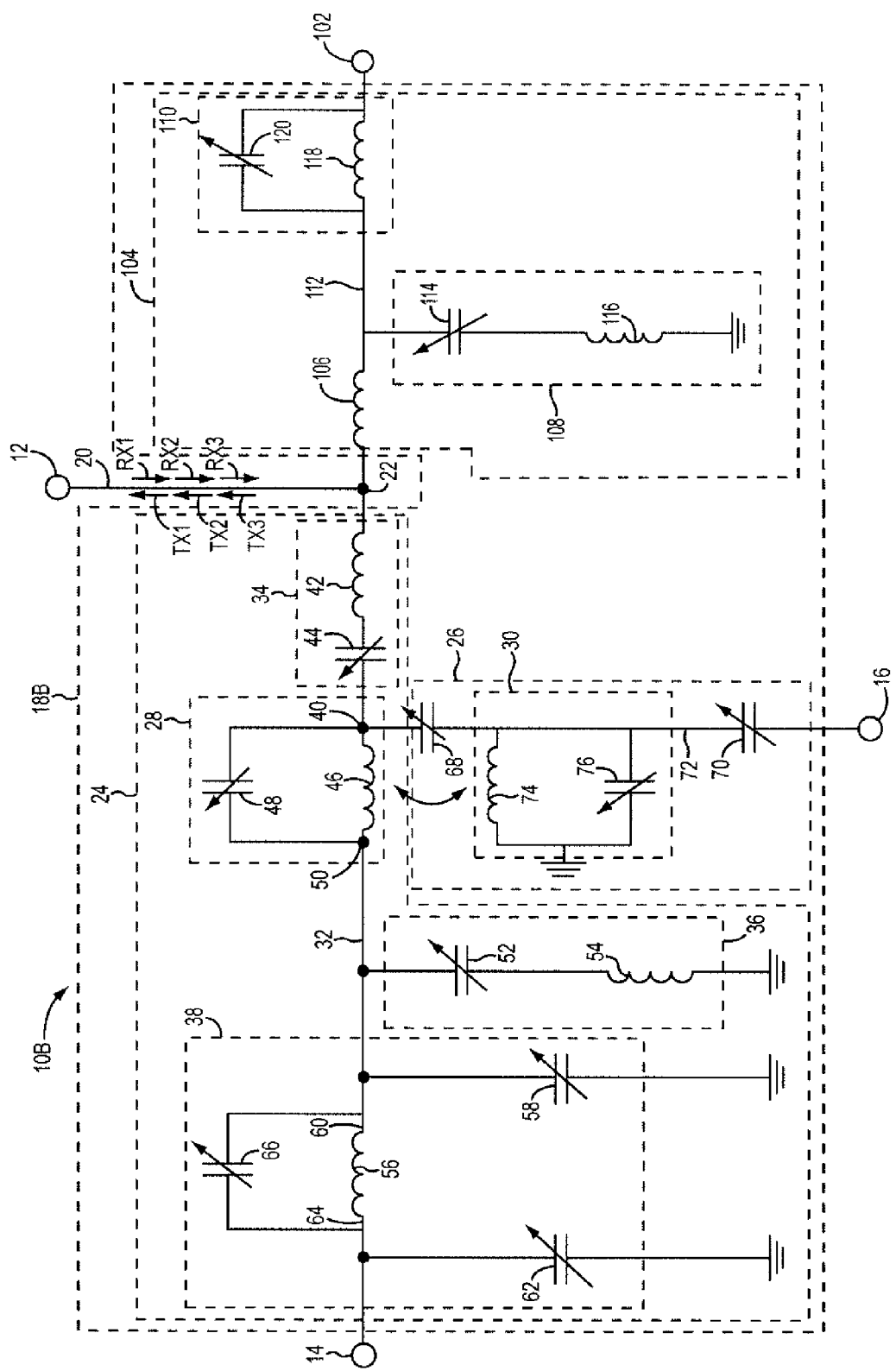
FIG. 4 illustrates another embodiment of multiplexing circuitry that includes the first filter path, the second filter path, and a third filter path.
Figure 14:
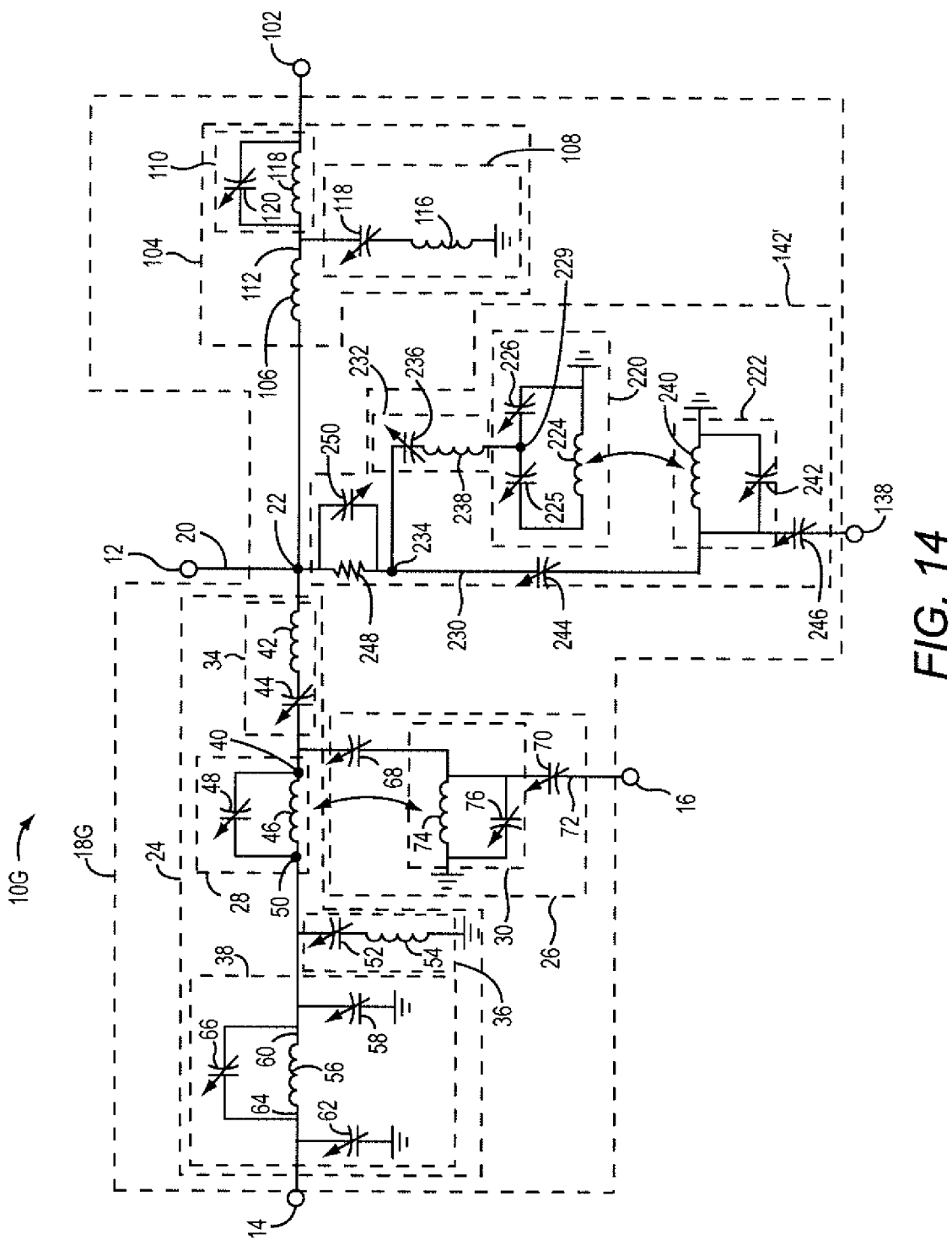

FIG. 14 illustrates still yet another embodiment of multiplexing circuitry having the first filter path shown in FIG. 1, the second filter path shown in FIG. 1, the third filter path shown in FIG. 4, and a fourth filter path with a pair of weakly coupled parallel resonant circuits each coupled in shunt.

Figure 15:
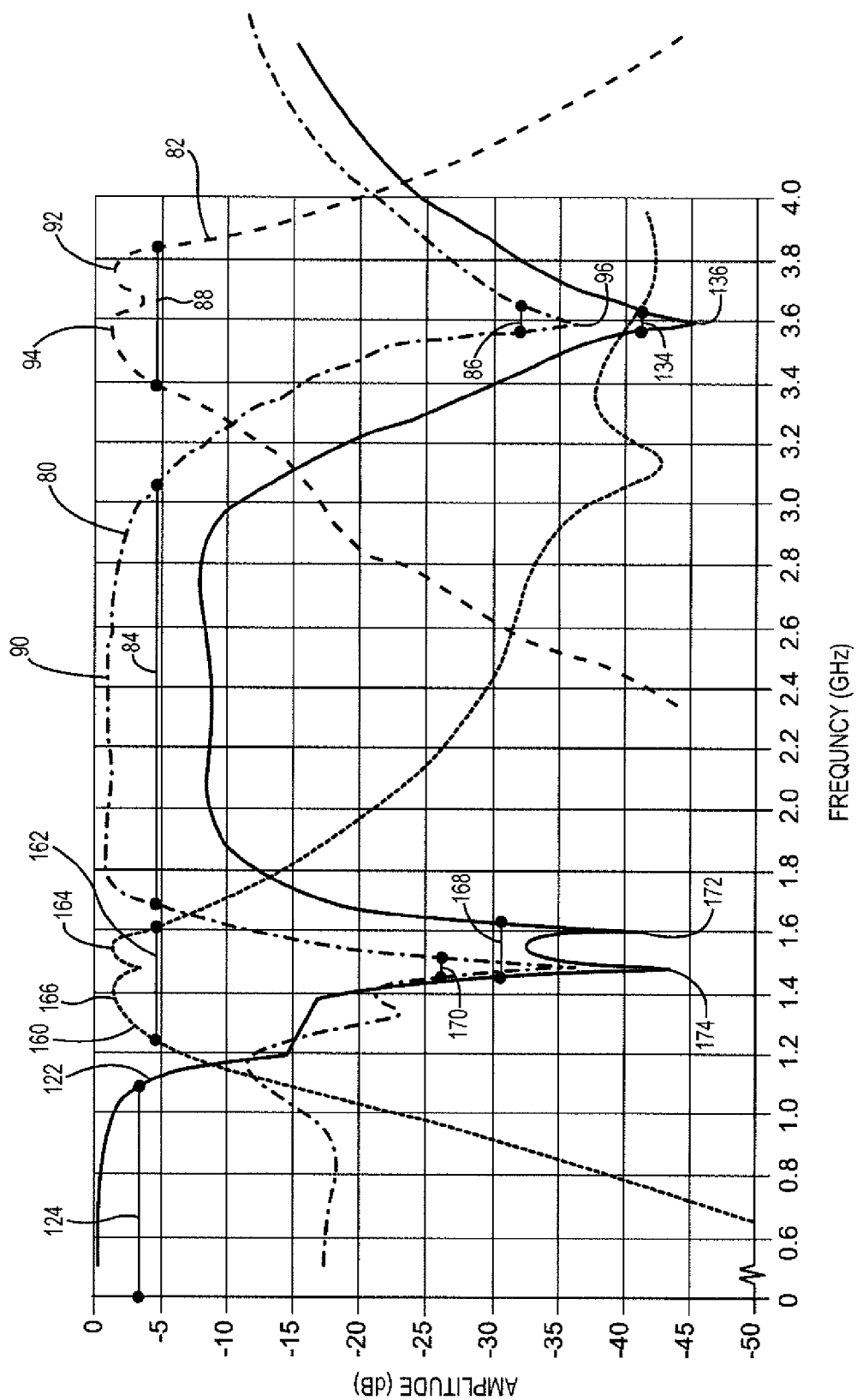

FIG. 15 illustrates a frequency response of the multiplexing circuitry shown in FIG. 14.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Throughout this disclosure, relative terminology, such as "approximately," "substantially," and the like, may be used in a predicate to describe features and relationships between features of a device or method. The relative terminology in the predicate should be interpreted sensu lato. However, whether the predicate employing the relative terminology is satisfied is determined in accordance to error ranges and/or variation tolerances relevant to the predicate and prescribed to the device or method by RF communication standards relevant to the RF application(s) employing the device or method. For example, the particular RF application employing the device or method may be designed to operate in accordance with certain communication standards, specifications, or the like. These communication standards and specification may prescribe the error ranges and/or variation tolerances relevant to the predicate or may describe performance parameters relevant to the predicate from which the error ranges and/or variation tolerances for the device or method can be deduced or inferred.

With regard to the term "port," a port refers to any component or set of components configured to input and/or output RF signals. To illustrate, a port may be provided as a node, pin, terminal, contact, connection pad, and/or the like or a set of the aforementioned components. For example, with regard to a single-ended signal, a port may be provided by a single node or a single terminal. However, in other embodiments for a differential signal, a port may be provided by a pair of terminals or nodes configured to receive and/or transmit differential signals.

Throughout this disclosure "weakly coupled" and/or "weak coupling" shall mean that a coupling coefficient between coupled components is within a range of approximately 0.0001 to approximately 0.4. Weak magnetic coupling or weak inductive coupling refers to a magnetic coupling coefficient within the aforementioned range while weak electric coupling or weak capacitive coupling refers to an electric coupling coefficient within the aforementioned range.

This disclosure is related generally to multiplexing circuitry for radio frequency (RF) front end circuitry and methods of operating the same. The multiplexing circuitry may be utilized anywhere within a wireless communication device, such as a cellular phone, a WiFi router, a tablet, a laptop, a personal computer, and/or the like. This multiplexing circuitry can be utilized to route RF signals within different RF communication bands anywhere within the RF front end circuitry of a communication device. For example, RF front end circuitry typically needs to route different RF signals to an antenna for wireless transmission and/or from the antenna after being wirelessly received from a remote device. Different RF transceiver chains in the RF front end circuitry will process RF receive signals received on the antenna within a particular frequency range. Furthermore, the RF transceiver chains may be utilized to generate RF transceiver signals within a particular frequency range so that they can be emitted wirelessly by the antenna. The various RF transceiver chains within the RF front end circuitry can each thus generate or process RF receive signals within different RF communication bands. The multiplexing circuitry described in this disclosure can be utilized in the RF front end circuitry to route RF signals to and from the different RF transceiver chains.

The multiplexing circuitry may include a common port, filtering circuitry, and several RF ports. The filtering circuitry is configured to route RF signals within a particular passband to or from a particular one of the RF ports. In this manner, RF signals within a particular one of the passbands can be routed from the common port to the corresponding RF port and/or from the corresponding RF port to the common port. In this manner, when an antenna is connected to the common port, RF signals within different RF communication bands can all be received or emitted wirelessly by the antenna since the multiplexing circuitry will route the appropriate signals to the RF port for the RF communication band of the RF signal. To RF signals within RF communication bands from interfering with one another and to lower insertion losses, the multiplexing circuitry utilizes weakly coupled resonators. As explained in further detail below, one of the advantages to utilizing weakly coupled resonators is that when weakly coupled resonators are utilized to create a passband within a particular path provided by the filtering circuitry, those weakly coupled resonators will automatically provide stopbands (e.g., notches) in that same passband in other paths provided by the filtering circuitry. Accordingly, each of these other paths does not require filtering components to prevent unnecessary perturbation noise/distortion and insertion losses and degradation from the path that provides the passband defined by the weakly coupled resonators. Thus, when multiple paths are provided by the filtering circuitry of the multiplexing circuitry, filtering components are not required in each of the paths to prevent interference and insertion losses and degradation from all of the other paths provided by the filtering circuitry. Instead, by using weakly coupled resonators, the weakly coupled resonators will automatically put stopbands in at least some of the frequency responses provided by the other paths. This thereby can be used to significantly reduce the number of filtering components required for the multiplexing circuitry. Lowering the number of resonant elements within the multiplexer helps reduce the unwanted interaction between different paths of the multiplexer. Furthermore, weakly coupled resonators have particularly high quality (Q) factors at high frequency bands and therefore are good filtering components. It should be noted that while the particular embodiments described below provide duplexing, triplexing, and quadplexing, the principles and techniques described herein can be utilized to provide multiplexing circuitry of any desired multiplexing degree, as would be recognized by a competent RF front end engineer in light of this disclosure.

FIG. 1A and FIGS. 1D-1G illustrates exemplary arrangements of radio frequency (RF) front end circuitry where the RF front end circuitry has add-drop band paths that are integrated with a traditional antenna signal path. It should be noted that the arrangements can be applied to a multiple antenna system. In general, the signal path coming from the antenna is a common (shared) path, which can be as small as just a common antenna port, or it can alternatively include one or more signal path components.

Figure 1A:
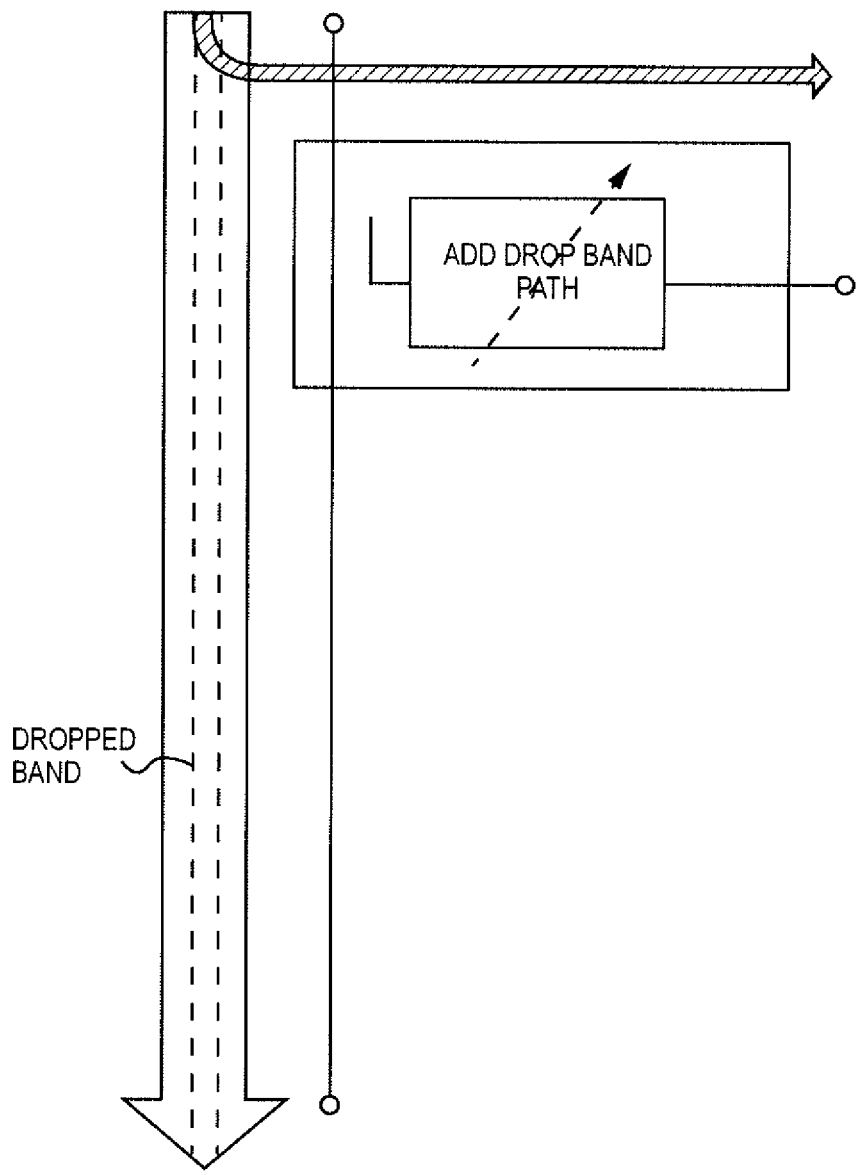
FIG. 1A illustrates an embodiment of radio frequency (RF) front end circuitry having a pass-through signal path and an add drop band path.

FIG. 1A illustrates an embodiment of RF front end circuitry having a pass-through signal path and an add drop band path. The add drop band path is connected to the pass-through signal path in order to ensure a frequency/multiplexing demultiplexing function with minimal impact on the pass-through signal path. In traditional tapping of the common path, the pass through signal path and tapped paths are loading each other and degrading their individual performances. The illustrated embodiment uses weakly coupled resonator structures so that the add drop band path taps the common path while ensuring minimal interaction with the performance of the common path due to intrinsic band rejection (notch). The notch is created through the tapping of the weakly-coupled resonator. The add drop band paths of FIGS. 1A and 1D-1G each include weakly coupled resonators, which may include at least two weakly coupled parallel resonators wherein at least one of the weakly coupled parallel resonators is coupled to the common path or to the split signal path.

Figure 1B:
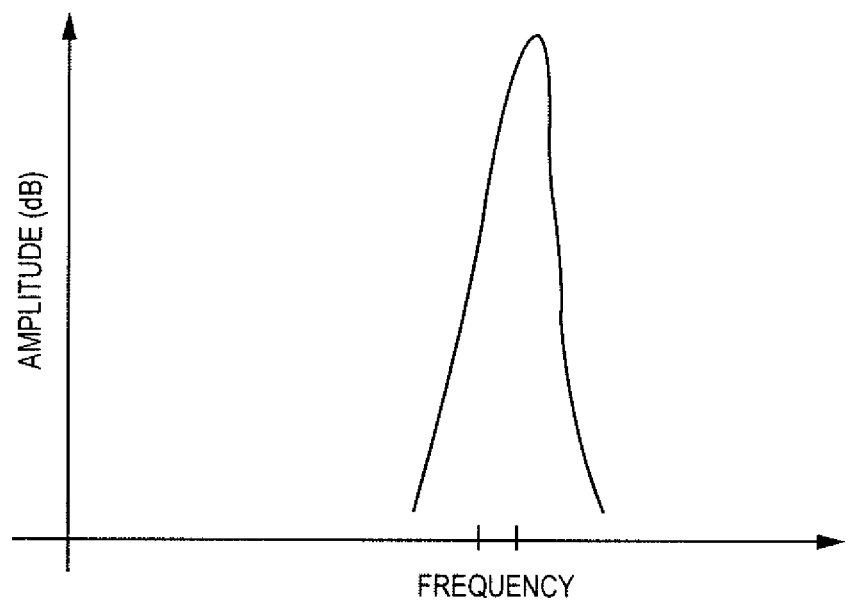
FIG. 1B illustrates an embodiment of a frequency response of the add drop band path shown in FIG. 1A.
Figure 1C:
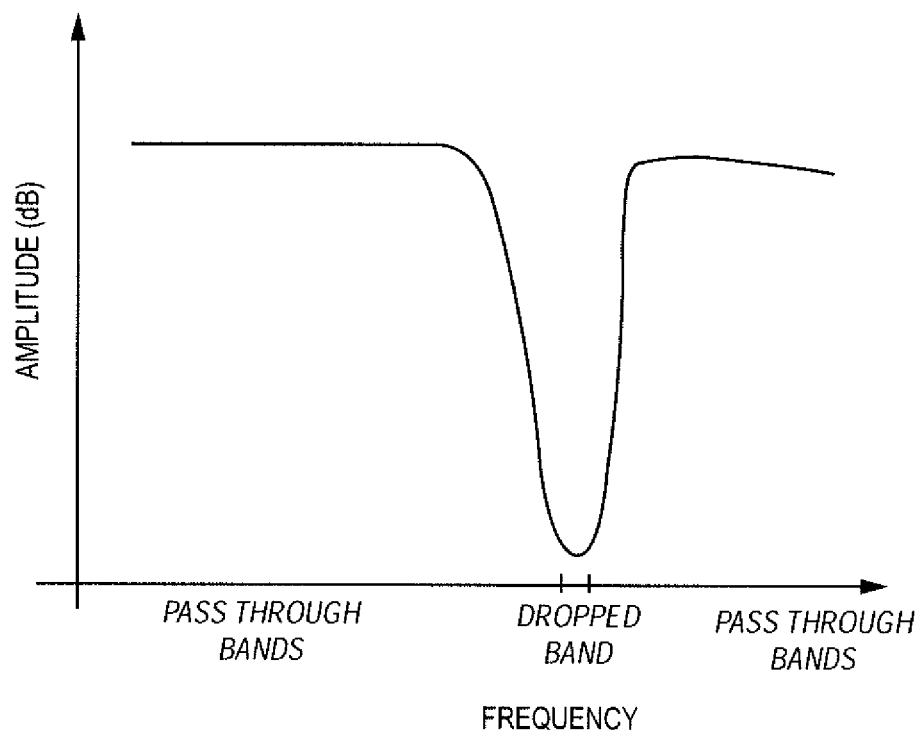
FIG. 1C illustrates an embodiment of a frequency response of the pass-through signal path shown in FIG. 1A.

FIG. 1B illustrates an embodiment of a frequency response of the add drop band path shown in FIG. 1A. As shown in Figure1B, the add-drop band path creates a passband so that an RF signal within the passband passes through the add drop band path. FIG. 1C illustrates an embodiment of a frequency response of the common path shown in FIG. 1A. FIG. 1C illustrates that the passband shown in FIG. 1B creates a stop band (e.g., a notch) in the frequency response of the common path, which is located at the passband provided by the add-drop band path.

Figure 1D:
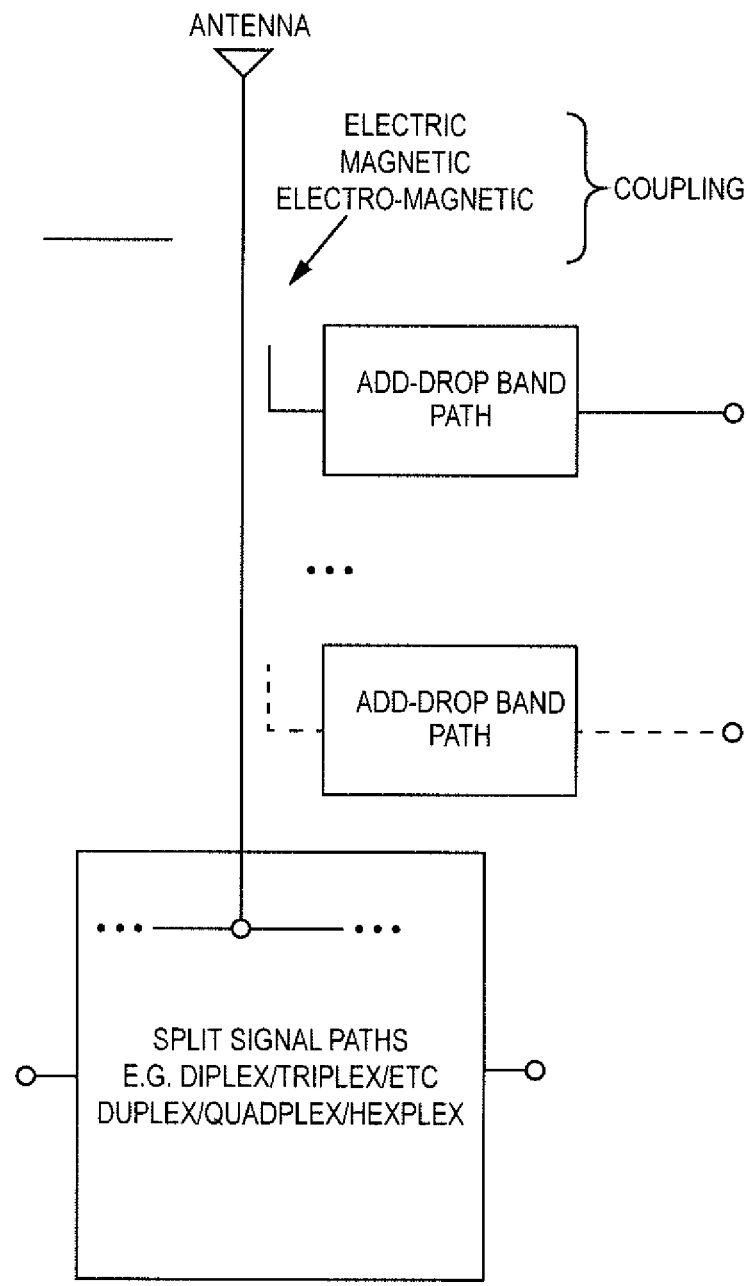
FIG. 1D illustrates an embodiment of RF front end circuitry having multiple add drop band paths operably associated with the pass-through signal path prior to a connection to split signal paths.

FIG. 1D illustrates an embodiment of RF front end circuitry having multiple add drop band paths operably associated with the common path prior to a connection to split signal paths. As such, FIG. 1D illustrates the add drop band structure integrated into the common branch of the antenna network. One or more such add drop paths can be tapped into the common antenna path. Examples of add drop paths that can be tapped directly into the common path are add drop paths with a passband or stopband in very high band (VHB) or ultra high band (UHB) frequency bands, such as 3.5 Ghz or 5 GHz frequency bands. Since these bands are far away and have frequency ranges significantly higher than the majority of other frequency bands, the add drop paths can be tapped directly into the common path before any high pass or low pass frequency diplexing is performed, and thus low interaction is provided with other signal paths. As shown in FIG. 1D, the RF front end circuitry also includes split signal paths for different frequency bands. The split signal paths may provide low-band and high band diplexing, triplexing, quadplexing, etc.

Figure 1E:
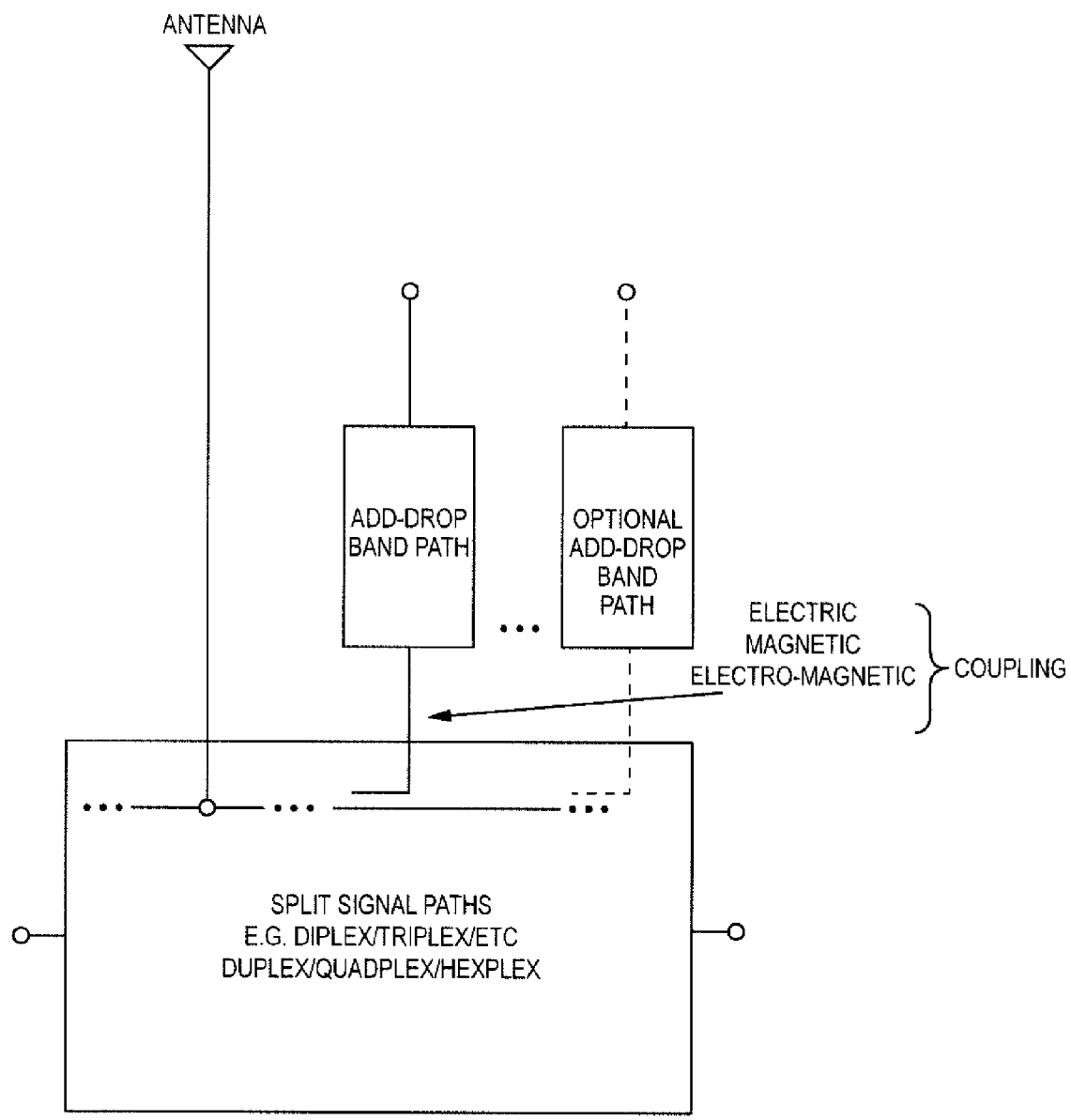
FIG. 1E illustrates an embodiment of RF front end circuitry having multiple add drop band paths operably associated with split signal paths.

FIG. 1E illustrates an embodiment of RF front end circuitry having multiple add drop band paths operably associated with split signal paths. The add drop band paths can be tapped off split signal paths that split off the common path. In the split signal paths, some type of filtering and/or signal processing is performed. Examples are low-pass, high-pass, bandpass, or band-reject. If the band that is multiplexed is adjacent or in a general transfer function of the split signal paths. It is advantageous to tap the add drop paths after the splitting of the split signal paths. One or more such add drop signal paths can be tapped off a given split signal path. The order in which the add drop signal paths are connected depends on their relative frequency position and the component used to perform the coupling (capacitive, inductive, resonant). One embodiment can start add drop frequency paths with passbands in the highest frequency ranges due to lower values of their constituent LC components for the coupling. In band multiplexing and/or demultiplexing circuits, the isolation between the different signal paths is important in ensuring minimal parasitic interaction between the processed signals. Poor isolation is in fact due to leakage of the signal from one signal path where it is the desired signal into another signal path where it is the undesired signal.

Figure 1F:
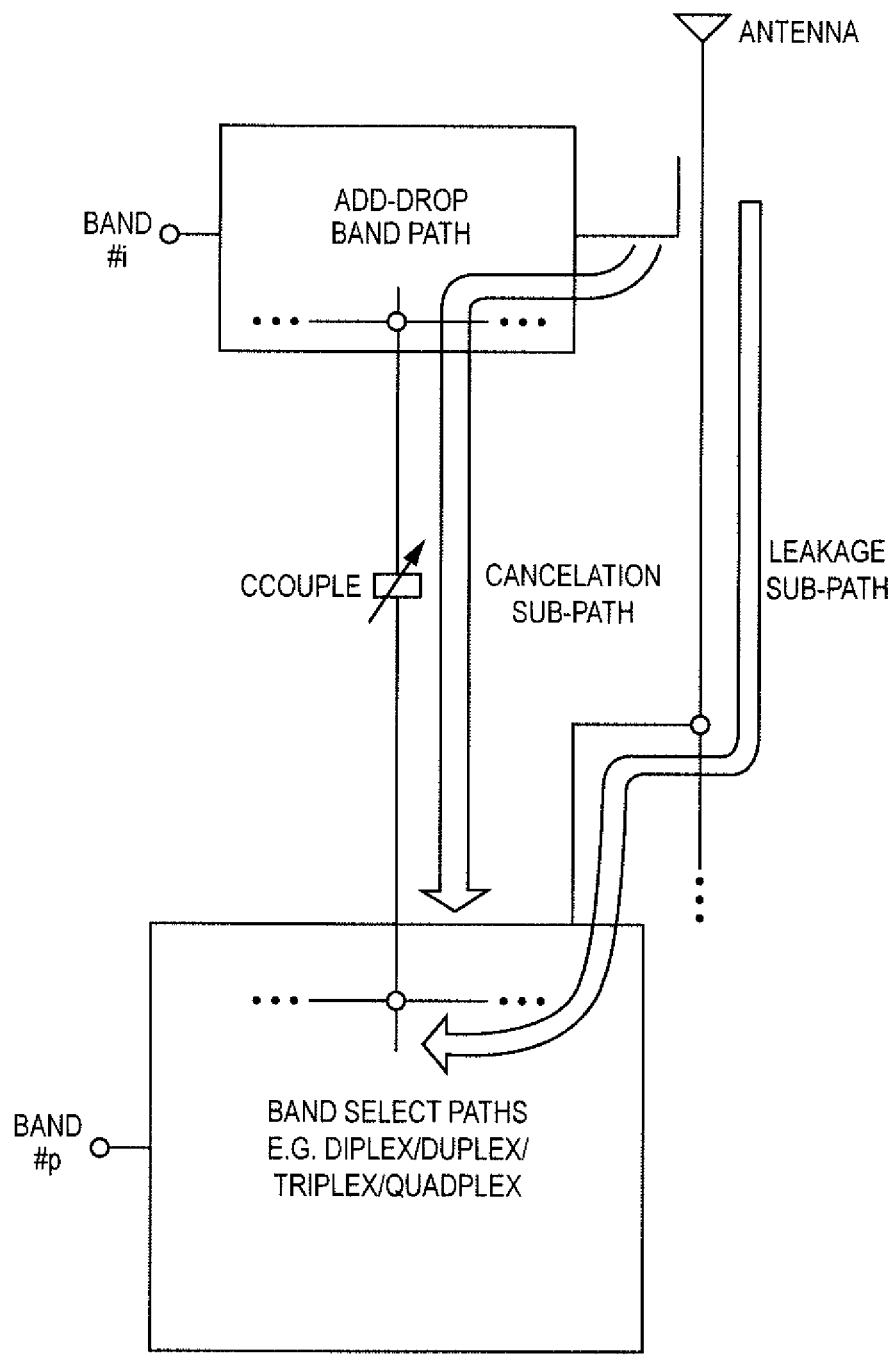
FIG. 1F illustrates an embodiment of RF front end circuitry having add drop band paths that utilize a cancellation path to improve isolation, wherein the add drop band paths and the cancellation path are electrically coupled.
Figure 1G:
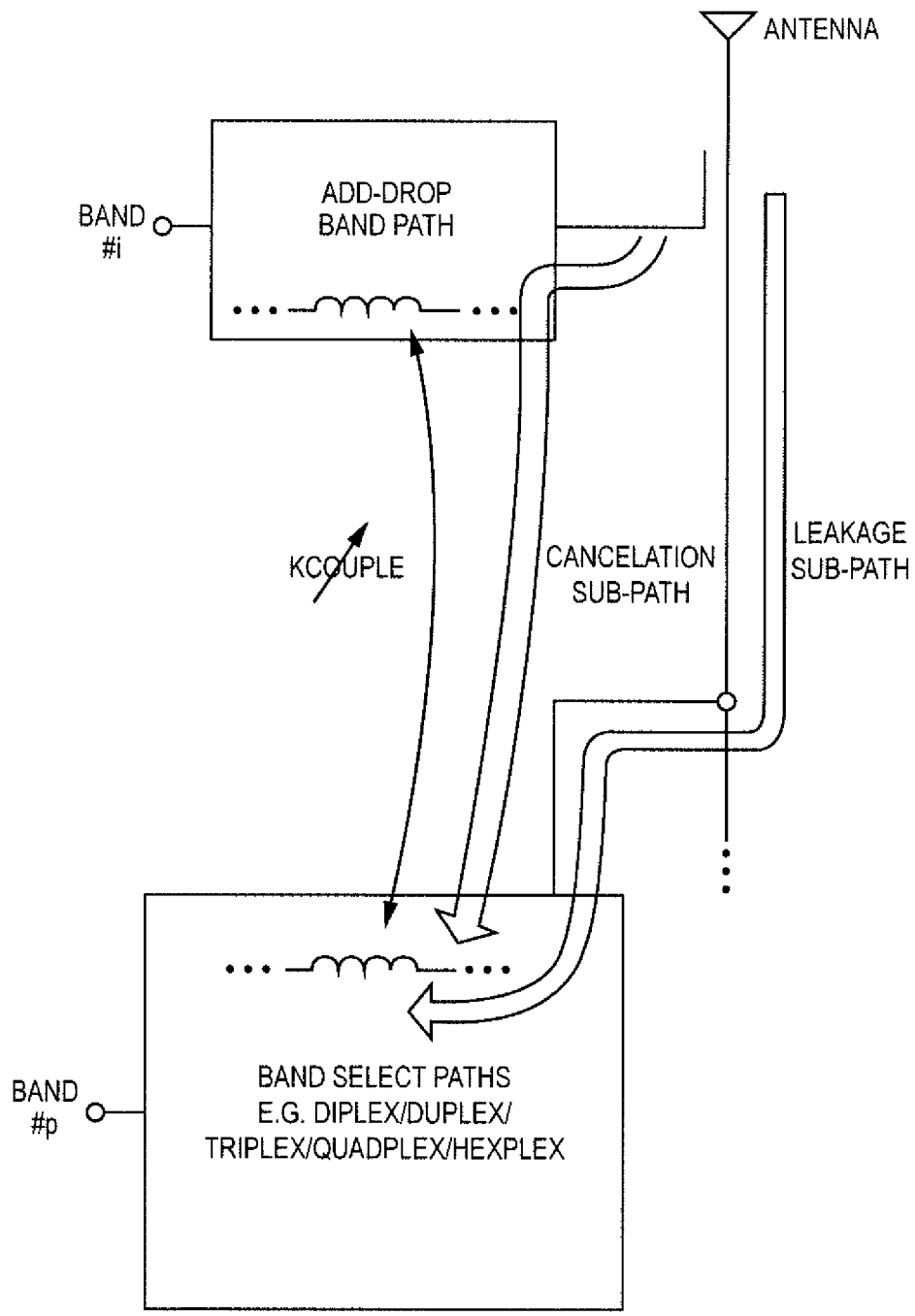
FIG. 1G illustrates another embodiment of RF front end circuitry having add drop band paths that utilize cancellation paths to improve isolation, wherein the add drop band paths and the cancellation path are magnetically coupled.

FIG. 1F and FIG. 1G illustrate RF front end circuitry designed to improve isolation in an N-plexer/multiplexer using at least one add-drop signal path. FIG. 1F illustrates an embodiment of RF front end circuitry having add drop band paths that utilize a cancellation path to improve isolation, wherein the add drop band paths and the cancellation path are electrically coupled. In FIG. 1F, add drop band paths are coupled to the common path, and a coupling capacitive element Ccouple is connected between the add drop band paths. The capacitive coupling provides a cancellation subpath that provides a reduction or even cancellation of the leakage current in the leakage subpath. If the leakage current is reduced or even cancelled, this results in a tremendous improvement of the isolation. The advantage of the weakly coupled resonator add drop frequency band multiplexer is that it provides different phases of the desired signal that can be tapped with a very small capacitive coupling to realize leakage current cancellation. The capacitive coupling is frequency dependent and usually results in a relatively narrow band leakage signal cancellation. The coupling capacitive element Ccouple is thus connected between the first add drop path and the second add drop path and is configured to bring a replica of a signal with a proper phase and a proper amplitude back into the common path such that the replica reduces or cancels a leakage signal into the common path.

FIG. 1G illustrates another embodiment of RF front end circuitry having add drop band paths that utilize cancellation paths to improve isolation, wherein the add drop band paths and the cancellation path are magnetically coupled. In this embodiment, an inductor in one of the weakly coupled resonators in one of the add drop band paths is weakly magnetically coupled to another inductor in one of the weakly coupled resonators in the other add drop band path. More specifically, a first inductor in one of the weakly coupled parallel resonators in the first add drop path is magnetically coupled to a second inductor in one of the weakly coupled parallel resonators in the second add drop path so as to bring a replica of a signal with a proper phase and a proper amplitude back into the common path such that the replica reduces or cancels a leakage signal into the common path. FIG. 1 illustrates multiplexing circuitry 10A in accordance with this disclosure. The multiplexing circuitry 10A shown in FIG. 1 includes a common port 12, a first RF port 14, and a second RF port 16. In this embodiment, the multiplexing circuitry 10A is a diplexer. Thus, the multiplexing circuitry 10A is configured to route an RF receive signal RX1 within a first RF communication band to the first RF port from the common port 12. Additionally or alternatively, the multiplexing circuitry 10A is configured to route an RF transmission signal TX1 provided within the same RF communication band as the RF receive signal RX1 to the common port 12. The multiplexing circuitry 10A is also configured to route an RF receive signal RX2 provided within a different RF communication band than the RF communication band of the RF receive signal RX1 to the second RF port 16. Additionally or alternatively, the multiplexing circuitry 10A is also configured to route an RF transmission signal TX2 within the same RF communication band as the RF receive signal RX2 from the second RF port 16 to the common port 12. RF receive signal RX1 and RF receive signal RX2 are generically referred to as RF receive signals RX; RF transmission TX1 and RF transmission signal TX2 are generically referred to as RF transmission signals TX; RF receive signal RX1 and RF transmission signal TX1 are generically referred to as first band RF signals RF1; the RF receive signal RX2 and the RF transmission signal TX2 are referred to generically as second band RF signals RF2; and finally, RF receive signal RX1, RF receive signal RX2, RF transmission signal TX1, and RF transmission signal TX2 are referred to generically as a group as RF signals RF.

In one application, the common port 12 is an antenna port that is directly connected to an antenna ANT. Alternatively, the common port 12 may be connected indirectly to the antenna ANT through an antenna tuner, other matching circuitry, or signal processing circuitry. The RF receive signals RX may be picked up after wireless communication from a remote device by the antenna ANT and transmitted to the common port 12. The multiplexing circuitry 10A includes filtering circuitry 18A. The RF receive signals RX are received at the common port 12 from the antenna ANT and transmitted along a common path 20 to a connection node 22. The filtering circuitry 18A connected to the connection node 22 and provides filtering so that the RF receive signal RX1 is transmitted to the first RF port 14 from the connection node 22, and the RF receive signal RX2 is transmitted to the second RF port 16 from the connection node 22. Additionally or alternatively, the filtering circuitry 18A is configured to receive the RF transmission signal TX1 and provide the transmission signal TX1 to the connection node 22. The RF transmission signal TX2 is configured to receive the RF transmission signal TX2 so that the RF transmission signal TX2 is transmitted to the connection node 22. The RF transmission signals TX then propagate through the common path 20 to the common port 12. In this manner, the transmission signals RF TX are received by the antenna ANT and emitted wirelessly to remote devices. The filtering circuitry 18A is thus coupled to the common port 12, the first RF port 14, and the second RF port 16. To route the first band RF signals RF1 to and from the common port 12 and the first RF port 14, the filtering circuitry is configured to provide a first transfer function between the common port 12 and the first RF port 14. The filtering circuitry 18A is configured to provide the first transfer function between the common port 12 and the first RF port 14 such that the first transfer function has a first passband. The first passband is aligned with the RF communication band of the RF signals RF1 so that the RF signals RF1 can pass to and from the first RF port 14 and the common port 12. More specifically, the filtering circuitry 18A has a first filter path 24 connected between the common port 12 and the first RF port 14. More specifically, in this embodiment, the first filter path 24 branches from the common path 20 so as to extend from the connection node 22 to the first RF port 14. The first filter path 24 is configured to provide the first passband in the first transfer function between the common port 12 and the first RF port 14. The filtering circuitry 18A also includes a second filter path 26 that is connected to the second RF port 16 and is operably associated with the first filter path 24. In particular, the second filter path 26 is operably associated with the first filter path 24 so that the second transfer function between the common port 12 and the second RF port 16 has a second passband. The second passband is aligned with the RF communication band of the RF signals RF2 so that the RF signals RF2 can be routed from the common port 12 to the second RF port 16. Thus the RF receive signal RX2 may be received at the common port 12 from the antenna ANT. The RF receive signal RX2 is the propagated through the common path 20 to the connection node 22. The RF receive signal RX2 then propagates from the connection node 22 through the second filter path 26 to the second RF port 16. Additionally or alternatively, the RF transmission signal TX2 is received at the second RF port 16 and propagates through the second filter path 26 to the connection node 22. From the connection node 22, the RF transmission sing TX2 propagates through the common path 20 to the common port 12. From the common port 12, the RF transmission signal TX2 is provided to the antenna ANT and emitted wirelessly to remote devices.

However, to prevent the second band RF signals RF2 from creating perturbation distortion/noise in the first filter path 24 and at the first RF port 14, the filtering circuitry 18A is configured to provide the first transfer function so that the first transfer function has a first stopband. More specifically, the first transfer function between the common port 12 and the first RF port 14 is provided such that the first stopband defined by the first transfer function is within the second passband provided by the second transfer function between the common port 12 and the second RF port 16. In this manner, noise from within the RF communication band of the second band RF signals RF2 through the first filter path 24 and the first RF port 14 is prevented or at least significantly reduced. Furthermore, by providing the first transfer function between the common port 12 and the first RF port 14 with a first stopband that is within the second passband provided between the common port 12 and the second RF port 16, insertion losses due to the second filter path 26 being operably associated with the first filter path 24 are significantly reduced.

To provide the first stopband of the first transfer function within the second passband of the second transfer function, the filtering circuitry 18A has a parallel resonant circuit 28 provided in series in the first filter path 24 and a parallel resonant circuit 30 provided in shunt with respect to the second filter path 26. The parallel resonant circuit 30 is weakly coupled to the parallel resonant circuit 28 such that the first stopband of the first transfer function is within the second passband of the second transfer function. More specifically, the parallel resonant circuit 28 provided in series within the first filter path 24 and the parallel resonant circuit 30 provided in shunt with respect to the second filter path 26 are weakly coupled so that the second passband is defined in the second transfer function between the common port 12 and the second RF port 16. However, weakly coupling the parallel resonant circuit 28 and the parallel resonant circuit 30 to one another also naturally creates the first stopband of the first transfer function between the common port 12 and the first RF port 14 since most or all of the signal energy within the second passband is channeled through the parallel resonant circuit 28 and the parallel resonant circuit 30. In this manner, by weakly coupling the parallel resonant circuit 28 to the parallel resonant circuit 30, the first stopband is naturally defined in the first transfer function between the common port 12 and the first RF port 14 without having to add additional filtering components within the first filter path 24 to provide the first stopband of the first transfer function of the filtering circuitry 18A.

As shown in FIG. 1, the first filter path 24 has a main branch 32 that extends from the connection node 22 to the first RF port 14. The first filter path 24 also includes sub-branches coming off the main branch 32. As explained in further detail below, the filtering components in the main branch 32 and in the sub branches coming off the main branch provide the desired response characteristics of the first filter path 24. More specifically, the first filter path 24 includes a series resonant circuit 34, the parallel resonant circuit 28, a series resonant circuit 36, and a matching network 38. The series resonant circuit 34 is provided by the filtering circuitry 18A in series within the first filter path 24 between the common port 12 and the parallel resonant circuit 28. More specifically, the series resonant circuit 34 is provided within the main branch 32 of the first filter path 24 and is connected between the connection node 22 and a connection node 40. In this embodiment, the series resonant circuit 34 includes an inductor 42 and a capacitive element 44 connected in series so as to form a series resonator. Series resonant circuit 34 is configured to resonate at a frequency within a first passband of the first transfer function provided between the common port 12 and the first RF port 14. However, the series resonant circuit 34 is configured to pass RF receive signals RX within the first passband of the RF signals RF1 and the second passband of the RF signals RF2.

To provide the roll-off necessary to create the first passband within the first transfer function between the common port 12 and the first RF port 14, the filtering circuitry 18A provides the parallel resonant circuit 28 in series in the first filter path 24. The parallel resonant circuit 28 shown in FIG. 1 includes an inductor 46 and a capacitive element 48 connected in parallel. The inductor 46 and the capacitive element 48 thereby form a parallel resonator. In this embodiment, the inductor 46 is connected within the main branch 32, and the capacitive element 48 is connected in parallel with the inductor 46 through a subpath. More specifically, the inductor 46 is connected between the connection node 40 and a connection node 50. The capacitive element 48 is connected in parallel with the inductor 46 between the connection node 40 and the connection node 50. The connection node 50 is coupled so as to provide a virtual ground. Furthermore, the parallel resonant circuit 28 is configured to resonate at a first frequency within the second passband of the second transfer function.

The filtering circuitry 18A further includes a series resonant circuit 36 provided in shunt with respect to the first filter path 24. More specifically, the series resonant circuit 36 is provided by the first filter path 24 so as to be coupled in shunt with respect to the main branch 32 of the first filter path 24. Thus the series resonant circuit 36 is provided within a shunt path and the series resonant circuit 36 is connected to the connection node 50, which provides the virtual ground. The series resonant circuit 36 is also configured to resonate at the first frequency within the second passband of the second transfer function. Thus the parallel resonant circuit 28 and the series resonant circuit 36 are each configured to resonate at substantially the same frequency. The series resonant circuit 36 thereby allows the parallel resonant circuit 28 to resonate at the first frequency within the second passband more effectively, since the series resonant circuit 36 will shunt RF noise to ground. In this embodiment, the series resonant circuit 36 includes a capacitive element 52 and an inductor 54 coupled in series within a subpath connected to the main branch 32. In this manner, the capacitive element 52 and the inductor 54 form a series resonator.

The filtering circuitry 18A also includes the matching network 38 within the first filter path 24. The matching network 38 is connected to the first RF port 14. The matching network 38 is tunable so as to match a port impedance of the first RF port 14 to a filter path impedance of the first filter path 24. In this embodiment, the matching network 38 is provided by an inductor 56 connected in series within the main branch 32 of the first filter path 24, a capacitive element 58 connected within a shunt path and to a first end 60 of the inductor 56, a capacitive element 62 connected within a shunt path and a second end 64 of the inductor 56 opposite the first end 60 and a capacitive element 66 connected in parallel with the inductor 56 and within a subpath. The inductor 56, the capacitive element 58, and the capacitive element 62 thus form a pi network. The pi network is configured to provide impedance transformation so that the impedance of the first filter path 24 as seen from the first end 60 of the inductor 56 is transformed to substantially equal the complex conjugate of the port impedance of the first RF port 14 as seen at the first RF port 14.

However, the pi network is also configured to provide an impedance transformation so that the port impedance as seen at the first RF port 14 is transformed to substantially equal the path impedance of the first filter path 24 as seen at the first end 60 of the inductor 56. The inductor 56 and the capacitive element 66 form a parallel resonator that can be utilized to provide a notch or increase the roll-off of the first passband provided by the first filter path 24. It should be understood that matching networks described in FIG. 1 are exemplary and that any other existing matching network may also be utilized within the circuitry described in this disclosure.

With respect to the second filter path 26, the second filter path 26 is connected to the first filter path 24 at the connection node 40 and extends to the second RF port 16. The second filter path 26 includes a capacitive element 68, the parallel resonant circuit 30, and a capacitive element 70. The second filter path 26 shown in FIG. 1 includes a main branch 72. The capacitive element 68 is connected in series within the second filter path 26 between the connection node 40 and the parallel resonant circuit 30. Thus, the capacitive element 68 is provided within the main branch 72 of the second filter path 26. The second parallel resonant circuit includes an inductor 74 in a capacitive element 76 coupled in parallel. More specifically, the inductor 74 is connected in a shunted subpath from the main branch 72 to ground. The capacitive element 76 is also coupled from the main branch 72 in a shunted path from the main branch 72 to ground. As such, the inductor 74 is coupled in parallel with the capacitive element 76 and in shut with respect to the second filter path 26. The capacitive element 70 is connected in series between the parallel resonant circuit 30 and the second RF port 16. The capacitive element 70 is thus connected in series and within the main branch 72 of the second filter path 26.

As mentioned above, the parallel resonant circuit 28 and the parallel resonant circuit 30 are weakly coupled to one another. Accordingly, the coupling factor between the parallel resonant circuit 28 of the first filter path 24 and the parallel resonant circuit 30 of the second filter path 26 has a coupling factor greater than 0 but less than or equal to 0.3. In this embodiment, the weak coupling between the parallel resonant circuit 28 and the parallel resonant circuit 30 is provided both through magnetic coupling and electric coupling. More specifically, the inductor 46 of the parallel resonant circuit 28 is magnetically coupled to the inductor 74 of the parallel resonant circuit 30. In addition, the capacitive element 68 is provided in series within the second filter path 26 and connected to the first filter path 24 at the connection node 40 so as to electrically couple the parallel resonant circuit 28 to the parallel resonant circuit 30. It should be noted that in alternative embodiments, the weak coupling between the parallel resonant circuit 28 and the parallel resonant circuit 30 may be provided only through magnetic coupling and thus the capacitive element 68 would not be provided. In other alternative embodiments, the weak coupling between the parallel resonant circuit 28 and the parallel resonant circuit 30 is provided through capacitive electrocoupling, and thus the inductor 46 and the inductor 74 in these embodiments would not be magnetically coupled. Returning to the filtering circuitry 18A shown in FIG. 1, the parallel resonant circuit 30 of the second filter path 26 is configured to resonate at a second frequency within the second passband of the second transfer function between the common port 12 and the second RF port 16. Since the parallel resonant circuit 28 and the parallel resonant circuit 30 are weakly coupled, and since the parallel resonator resonates at the first frequency within the second passband and the parallel resonant circuit 30 resonates within the second frequency within the passband, the second filter path 26 is operably associated with the first filter path 24 so that the second transfer function between the common port 12 and the second RF port 16 provides a second passband. Note that since the parallel resonant circuit 28 and the parallel resonant circuit 30 are weakly coupled, the first frequency within the second passband and the second frequency within the second passband are relatively close to one another and thus the second passband of the second transfer function between the common port 12 and the second RF port 16 has a relatively high quality factor. Furthermore, the weak coupling between the parallel resonant circuit 28 and the parallel resonant circuit 30 provides the first stopband within the first transfer function between the common port 12 and the first RF port 14, as explained above.

In this embodiment, the capacitive element 44, the capacitive element 48, the capacitive element 68, the capacitive element 52, the capacitive element 58, the capacitive element 62, and the capacitive element 66 are each variable capacitive elements and thus make the filtering circuitry 18A tunable so that the first passband, the second passband, and the first stopband can be transposed to different RF communication bands. The capacitive element 44, the capacitive element 48, the capacitive element 52, the capacitive element 58, the capacitive element 62, the capacitive element 66, the capacitive element 68, the capacitive element 70, and the capacitive element 76 may be any type of variable capacitive element such as a varactor, a programmable array of capacitors, and/or the like. In other embodiments, the filtering circuitry 18A may not be tunable or may be only partially tunable and thus one or more of the capacitive elements 44, 48, 52, 58, 62, 66, 68, 70, 76 may be provided as a passive capacitive element such as a capacitor or capacitive transmission line. In the embodiment shown in FIG. 1, the capacitive element 70 is a variable capacitive element having a variable capacitance. The capacitive element 70 is provided in series within the second filter path 26 and is connected to the second RF port 16. The capacitive element 70 is tunable so as to match a port impedance of the second port with the path impedance of the second filter path 26. Similarly, the capacitive elements 44, 48, 52, 58, 62, 66, 68, and 76 each have a variable capacitance, and thus the filtering circuitry 18A is tunable to transpose the first passband and first stopband within the first transfer function and the second passband of the second transfer function to different frequency ranges. The inductors 42, 46, 54, 56, and 74 may be provided as any suitable type of inductor including planar coils, three-dimensional inductors, vertical inductors, and/or the like. In particular, since the parallel resonant circuit 28 and the parallel resonant circuit 30 are weakly coupled, the inductor 46 and the inductor 74 may be provided as described in U.S. patent application Ser. No. 14/099,007 entitled "HIGH Q FACTOR INDUCTOR STRUCTURE," filed on Dec. 6, 2013, now U.S. Pat. No. 9,196,406; U.S. patent application Ser. No. 14/215,800 entitled "WEAKLY COUPLED BASED HARMONIC REJECTION FILTER FOR FEEDBACK LINEARIZATION POWER AMPLIFIER," filed on Mar. 17, 2014; and U.S. patent application Ser. No. 14/450,156, entitled "ADVANCED 3D STRUCTURE WITH CONFINED MAGNETIC FIELDS," filed on Aug. 1, 2014, which are each hereby incorporated by reference in their entirety. Inductor structures described in the foregoing disclosures allow for the inductor 46 and the inductor 74 to be magnetically coupled by weak coupling but with a compact arrangement.

Referring now to FIGS. 1 and 2, FIG. 2 illustrates one embodiment of a first transfer function 80 between the common port 12 and the first RF port 14 and an embodiment of the second transfer function 82 between the common port 12 and the second RF port 16 of the multiplexing circuitry 10A shown in FIG. 1. The first transfer function 80 defines an embodiment of a first passband 84 and a stopband 86. The second transfer function 82 defines a second passband 88. The first passband 84 and the second passband 88 are each defined by a center frequency defined by one or more local maxima and the frequencies at the three dB locations lower than the local maxima or the average of the local maxima. For example, the first passband 84 has a local maxima 90 located at the frequency fC1. The three dB locations (i.e., the edges of the first passband 84) are located at frequency fHE1 and at frequency fLE1 since the first transfer function 80 is three dB lower than at the local maxima 90 at the frequency fHE1, fLE1. The second passband 88 of the second transfer function 82 has a center frequency fC2, local maxima 92, and local maxima 94. The local maxima 92 is provided by the parallel resonant circuit 28 of the first filter path 24 wherein the parallel resonant circuit 28 is configured to resonate at the frequency fR1 where the frequency fR1 provides correspondence to the location of the local maxima 92. The frequency fR1 is within the second passband 88 but greater than the center frequency fC2. The second transfer function 82 also includes another local maxima 94 at the frequency fR2. The frequency fR2 is below the center frequency fC2. The frequency fR2 corresponds to the location of the local maxima 94 where the frequency fR2 is within the second passband 88 of the second transfer function 82. The local maxima 94 is created by the parallel resonant circuit 30 which is configured to resonate at the frequency fR2 within the second passband 88. An average amplitude between the local maxima 92 and the local maxima 94 is determined where a high edge frequency fHE2 of the second passband 88 is located at the location of the second transfer function 82 three dB lower than the average peak magnitude and the lower edge frequency fLE2 of the second passband 88 is located at the frequency fLE2, which is three dB lower than the average peak magnitude. The center frequency fC2 is then selected to be the frequency at the center of the second passband 88. The stopband 86 of the first transfer function 80 is located within the second passband 88 of the second transfer function 82 due to the weak coupling between the parallel resonant circuit 28 of the first filter path 24 and the parallel resonant circuit 30 of the second filter path 26. The first stopband is also defined by taking a minimum or an average between local minima and finding the three dB points that are higher than the amplitude of the local minima or average local minima. In this embodiment, the stopband 86 is provided as a notch since the stopband 86 has a local minima 96 created by a pole or zero (depending on how the first transfer function 80 is expressed mathematically) that is relatively narrow. The local minima 96 is located at the center frequency fC3. The high edge frequency of the stopband 86 is located at the frequency fSH1 since the first transfer function 80 is three dB higher than the local minima 96 at the frequency fSH1. The low edge frequency of the stopband 86 is located at the frequency fSL1 since the first transfer function 80 is three dB high than the local minima 96 at the frequency fSL1. The stopband 86 of the first transfer function 80 is created by the parallel resonant circuit 30 being weakly coupled to the parallel resonant circuit 28, as shown above with respect to FIG. 1. In this embodiment, a stopband 98 is also provided within the second transfer function 82 between the common port 12 and the second RF port 16. The stopband 98 is a notch provided by the inductor 56 and the capacitive element 66 of the first filter path 24. In particular, the inductor 56 and the capacitive element 66 resonate at the center frequency of the stopband 98 which provides a local minima 100. The high edge frequency of the stopband 98 is located at the frequency fSH2 since the second frequency response is three dB higher than the local minima 100 at the frequency fSH2. The lower edge frequency of the stopband 98 is located at the frequency fSL2 since the second transfer function 82 is three dB higher than the local minima 100 at the frequency fSL2.

With respect to the second transfer function 82, the second passband 88 includes the local maxima 92 and the local maxima 94 since the parallel resonant circuit 28 is configured to resonate at the frequency fR1 and the parallel resonant circuit 30 is configured to resonate at the frequency fR2. There are two ripples created in the second passband 88 due to the fact that the second passband 88 is created with the parallel resonant circuit 28 and the parallel resonant circuit 30. It should be noted however that in other embodiments, the second filter path 26 may include one or more additional parallel resonant circuits coupled in shunt with respect to the second filter path 26 and weakly coupled to the parallel resonant circuit 30 and the parallel resonant circuit 28. As such, one or more additional local maxima and ripples may be provided in the second passband 88 due to the one or more additional parallel resonant circuits provided in the second filter path 26. The first passband 84 is assumed to be within an RF communication band that has a frequency range that is higher than the RF communication band in which the second passband 88 is provided. Thus, in the embodiment shown in FIG. 2, the second passband 88 is provided to have frequencies that are lower than the first passband 84. For example, the first passband 84 may be provided in an RF communication band considered to be a very high RF communication band. The very high RF communication band may be between 5.5 and 5.8 GHz. The second passband 88 and the stopband 86 may be provided in an RF communication band somewhere between 3.3 GHz and 5.5 GHz. This may be considered to be provided by a WiFi highband. Alternatively, the first passband 84 may be considered to be within an RF communication band between 3 and 3.6 GHz, which is also considered a highband. The second passband 88 would then be provided within a WiFi 2.4 GHz communication band. As noted, however, the filtering circuitry 18A may be tunable so as to transpose the first passband 84, second passband 88, the stopband 86, and the stopband 98 within other RF communication bands. To shift the second passband 88 of the second transfer function 82, a variable capacitance of the capacitive element 48 and a variable capacitance of the capacitive element 76 may be adjusted in order to shift the local maxima 92 and local maxima 94 to frequencies within another RF communication band. Also, a variable capacitance of the capacitive element 68 may be adjusted to change the coupling factor between the parallel resonant circuit 28 and the parallel resonant circuit 30 and thereby also shift the local maxima 92 and the local maxima 94. The stopband 86 will follow the shift of the second passband 88 since the stopband 86 of the first transfer function 80 is provided by the weak coupling between the parallel resonant circuit 28 and the parallel resonant circuit 30. The stopband 98 can be transposed by adjusting the variable capacitance of the capacitive element 66.

The first passband 84 of the first transfer function 80 may also be transposed to a different RF communication band by adjusting a variable capacitance of the capacitive element 44, the variable capacitance of the capacitive element 58, and the variable capacitance of the capacitive element 62.

Figure 3:
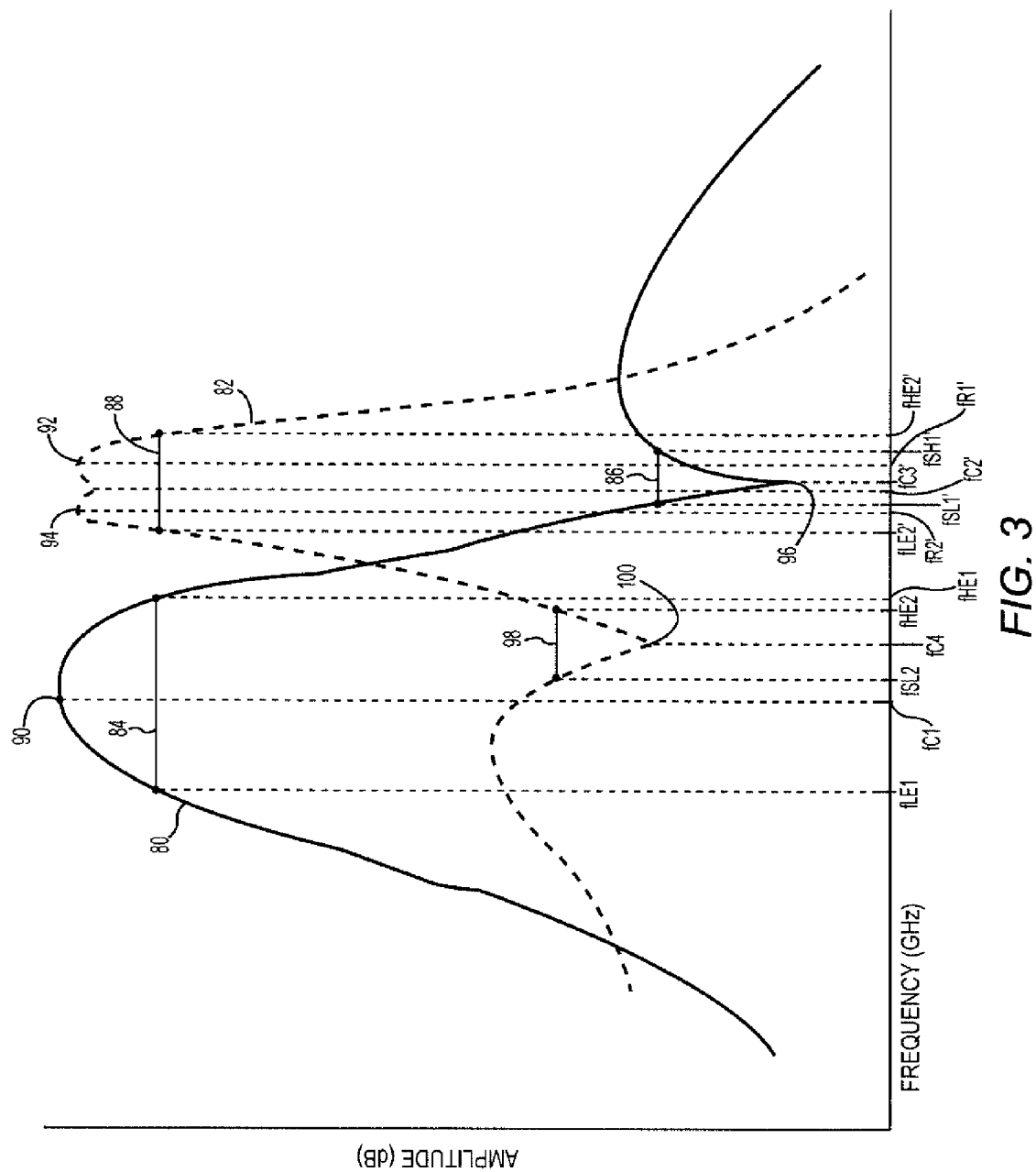
FIG. 3 illustrates a frequency response of the multiplexing circuitry shown in FIG. 1 once the second passband described in FIG. 2 is transposed within a different frequency range.

Referring now to FIG. 1 and FIG. 3, FIG. 3 illustrates the first transfer function 80 and the second transfer function 82 after the second passband 88 of the second transfer function 82 is transposed to an RF communication band that is in a frequency range higher than the first passband 84 of the first frequency response. As demonstrated by comparing FIGS. 2 and 3, the filtering circuitry 18A shown in FIG. 1 is tunable such that transposing the second passband 88 of the second transfer function 82 to a different frequency range also transposes the stopband 86 within the same frequency range of the second passband 88. In other words, the stopband 86 of the first transfer function 80 will follow the second passband 88 of the second transfer function 82 so that the stopband 86 of the first transfer function 80 remains within the second passband 88 of the second transfer function 82 once the second passband 88 of the second transfer function 82 is transposed to a different frequency range. In the illustrated embodiment shown in FIG. 3, the first passband 84 of the first transfer function 80 is maintained as described above with respect to FIG. 2. Similarly, the stopband 98 of the second transfer function 82 is also maintained as described above with respect to FIG. 2. However, the variable capacitance of the capacitive element 48 or the parallel resonant circuit 28 is tuned to resonate at a frequency fR1' while the variable capacitance of the capacitive element 76 of the parallel resonant circuit 30 is tuned to resonate at the frequency fR2'. This thereby results in the local maxima 92 being transposed to the frequency fR1' and the local maxima 94 being transposed to the frequency fR2'. As a result, the second passband 88 of the second transfer function 82 is transposed so that a center frequency of the second passband 88 is provided at the frequency fC2'; the low edge frequency of the second passband 88 is provided at the frequency fLE2'; and the high edge frequency of the second passband 88 is provided at the frequency fHE2'. As shown in FIG. 3, since the second passband 88 of the second transfer function 82 is transposed to a frequency range from the frequency fLE2' to the frequency fHE2', the stopband 86 of the first transfer function 80 is also transposed so as to be within the second passband 88 of the second transfer function 82. In this embodiment, the stopband 86 of the first transfer function 80 is provided as a notch having a center frequency fC3', where the local minima 96 is now located. The low edge frequency of the stopband 86 is provided at the frequency fSL1' and the high edge frequency of the stopband 86 is provided at the frequency fSH1'. As shown in FIG. 3, the frequencies fSL1', fC3', and fSH1' are provided within the frequency range from fLE2' to fHE2'. Accordingly, the stopband 86 has been transposed to be within the second passband 88 of the second transfer function 82. In one embodiment, the second passband 88 and the stopband 86 are provided within a very high frequency RF communication band which is in a frequency range greater than the very high frequency RF communication band of the first passband 84. In another example, the stopband 86 and the second passband 88 are provided in a high frequency RF communication bad which is greater than the medium frequency RF communication band in which the first passband 84 is provided.

Figure 3A:
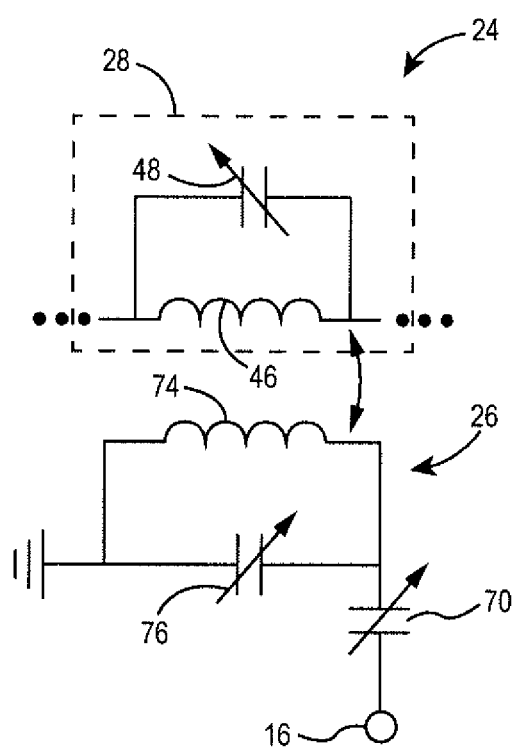
FIG. 3A illustrates another implementation of the first filter path and the second filter path being coupled to one another.

FIG. 3A illustrates another implementation of the first filter path 24 and the second filter path 26 being coupled to one another. As in FIG. 2, the parallel resonator 28 is directly connected in series within the first filter path 24. The parallel resonator 28 is weakly coupled to the parallel resonator 30, which is connected in shunt with respect to the second filter path 26 to provide resonator coupling. In this embodiment, the inductor 46 and the inductor 74 are magnetically coupled, and no electric coupling is provided between the resonators 28, 30. In other embodiments, only electric coupling or both electric and magnetic coupling may be provided between the resonators 28, 30. For example, in the embodiment illustrated in FIG. 2, the capacitive element 68 provides electric coupling between the resonators 28, 30.

FIG. 4 illustrates another embodiment of multiplexing circuitry 10B, which in this embodiment is a triplexer. The multiplexing circuitry 10B includes the common port 12, the first RF port 14, the second RF port 16, a third RF port 102, and an embodiment of filtering circuitry 18B. The filtering circuitry 18B includes the first filter path 24 and the second filter path 26 described above with respect to FIG. 1. However, in this embodiment, the filtering circuitry 18B is further configured to provide a third transfer function between the common port 12 and the third RF port 102. As such, the filtering circuitry 18B shown in FIG. 4 includes a third filter path 104 that is configured to provide a third passband and a third transfer function between the common port 12 and the third RF port 102. In this manner, an RF receive signal within an RF communication band different from both the RF communication band of the RF receive signal RX1 and RF receive signal RX2 can be routed from the common port 12 to the third RF port 102 since the third passband of the third transfer function provided by the third filter path 104 is provided within the RF communication band of the RF receive signal RX3. Additionally or alternatively, the RF transmission signal TX3 may also be received at the third RF port 102 and routed to the common port 12 since the RF transmission signal TX3 may be provided in the same RF communication band as the RF receive signal RX3.

In this embodiment, the third filter path 104 branches from the common path 20 so as to extend from the connection node 22 to the third RF port 102. The third filter path 104 includes an inductor 106 connected in series within the third filter path 104, a series resonant circuit 108, coupled in shunt with respect to the third filter path 104, and a parallel resonant circuit 110 connected in series within the third filter path 104. More specifically, the third filter path 104 has a main branch 112. The inductor 106 is connected within the main branch 112 between the connection node 22 and the series resonant circuit 108. The series resonant circuit 108 includes a capacitive element 114 and an inductor 116 connected in series within a subpath shunted from the main branch 112. The parallel resonant circuit 110 includes an inductor 118 and a capacitive element 120 connected in parallel with one another. The parallel resonant circuit 110 provides a matching network. The parallel resonant circuit 110 is connected in series between the series resonant circuit 108 and the third RF port 102. The inductor 118 in this embodiment is connected within the main branch 112 between the series resonant circuit 108 and the third RF port 102 while the capacitive element 120 is connected in a subpath that is connected in parallel with respect to the inductor 118. It should be noted that the filtering components, which in FIG. 4 are provided by the inductor 106 and the series resonant circuit 108, and the matching network, which is currently provided by the parallel resonant circuit 110, can be provided in any suitable manner in alternate embodiments.

The third filter path 104 shown in FIG. 3 is tunable so that the third passband is provided within low frequency RF communication bands and medium frequency RF communication bands. The third filter path can be provided as a low pass filter where the third passband would be defined from a frequency of zero to a high edge frequency defined by a three dB point as explained in further detail below. A variable capacitance of the capacitive element 120 and a variable capacitance of the capacitive element 114 may be adjusted in order to transpose the third passband defined by the third transfer function between the common port 12 and the third RF port 102. As explained above with respect to FIG. 1, the parallel resonant circuit 28 in the first filter path 24 is weakly coupled to the parallel resonant circuit 30 of the second filter path 26. As a result, the third transfer function between the common port 12 and the third RF port 102 also defines a stopband within the second passband of the second transfer function between the common port 12 and the second RF port 16. Thus, by weakly coupling the parallel resonant circuit 28 of the first filter path 24 to the parallel resonant circuit 30 of the second filter path 26, a stopband is automatically provided by the third transfer function between the common port 12 and the third RF port 102 within the second passband of the second transfer function.

Figure 5:
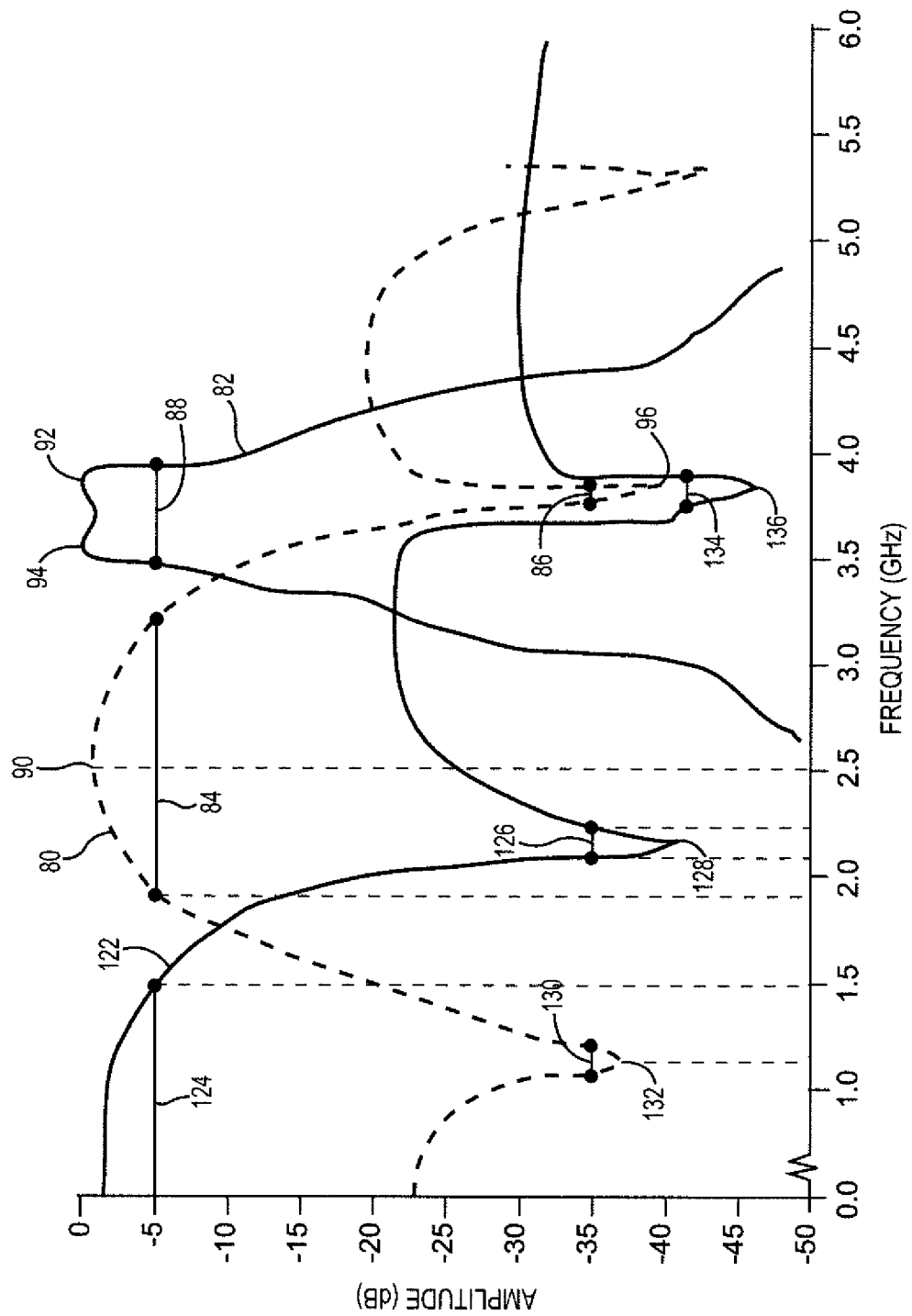
FIG. 5 illustrates a frequency response of the multiplexing circuitry shown in FIG. 4.

Referring now to FIGS. 4 and 5, FIG. 5 illustrates an exemplary frequency response of the multiplexing circuitry trend B shown in FIG. 4. In this example the first passband 84 of the first transfer function 80 is provided to have a low edge frequency of around 1.8 GHz and a high edge frequency of around 3.3 GHz. The local maxima 90 of the first passband 84 is provided at around 2.5 GHz. The second passband 88 of the second transfer function 82 has the low edge frequency at approximately 3.3 GHz and the high edge frequency at approximately 4 GHz. The local maxima 92 is provided at around 3.75 GHz since the parallel resonant circuit 28 has been tuned to resonate at this frequency.

Additionally, the local maxima 94 is provided at around 3.65 GHz since the parallel resonant circuit 30 is configured to resonate at this frequency. In the same manner described above, the first transfer function 80 includes the stopband 86 within the second passband 88 of the second transfer function 82. Again, this is provided by the parallel resonant circuit 28 of the first filter path 24 and the parallel resonant circuit 30 of the second filter path 26 being weakly coupled. In this embodiment, a center frequency of the stopband 86 is provided at approximately 3.8 GHz so that the local minima 96 is provided at this frequency.

As shown in FIG. 5, the filtering circuitry 18B illustrates an example of the third transfer function 122 provided by the filtering circuitry 18B between the common port 12 and the third RF port 102. The third filter path 104 shown in FIG. 1 is configured to provide a third passband 124 in the third filter response of the filtering circuitry 18B between the common port 12 and the third RF port 102. As shown in FIG. 5, the third filter path 104 has been tuned to operate as a low pass filter so that the third passband 124 passes all frequencies between 0 GHz and 1.5 GHz. Since the third filter path 104 provides low pass filtering, the third passband 124 of the third transfer function 122 does not have a low edge frequency provided 3 dB below the maximum or average maximum of the third transfer function 122 within the third passband 124. Instead, the third passband 124 simply continues to the frequency of 0 GHz, which thereby provides the low edge frequency of the third passband 124. The third passband 124, however, does have a 3 dB point below the maxima or the average maxima of the third passband 124, which in this case is provided at around 1.5 GHz. Therefore, the center frequency of the third passband 124 is provided at approximately 0.75 GHz.

To provide adequate roll-off for the third passband and to prevent insertion losses from the first filter path, the variable capacitance of the capacitive element 120 and the variable capacitance of the capacitive element 114 of the parallel resonant circuit 110 and the series resonant circuit 108 are each tuned so that the parallel resonant low edge frequency is approximately 2.1 GHz of approximately 2.3 GHz. In this example, the stopband 126 of the third transfer function 122 is a notch. In addition, the variable capacitance of the capacitive element 66 is tuned so that the first transfer function 80 between the common port 12 and the first RF port 14 provides a stopband 130 within the third passband 124 of the third transfer function 122. In this case, a local minima of the stopband 130 is provided at approximately 1.2 GHz while the stopband 130 has a low end edge frequency at approximately 1.1 GHz and a high end edge frequency at approximately 1.3 GHz.

Furthermore, since the parallel resonant circuit 28 of the first filter path 24 is weakly coupled to the parallel resonant circuit 30 of the second filter path 26, the third transfer function 122 includes a stopband 134 within the second passband 88 of the second transfer function 82. In other words, the weak coupling of the parallel resonant circuit 28 of the first filter path 24 and the parallel resonant circuit 30 of the second filter path 26 automatically creates the stopband 134 in the third transfer function between the common port 12 and the third RF port 102 without having to provide additional filtering components in the third filter path 104. In this embodiment, the stopband 134 of the third transfer function 122 has a local minima 132 at approximately 3.7 GHz, a low end edge frequency at approximately 3.8 GHz and a high end edge frequency at approximately 3.8 GHz. The local minima 136 of the stopband 134 in this case also provides the center frequency of the stopband 134. In the example shown in FIG. 5, stopband 134 is provided as a notch.

Figure 6:
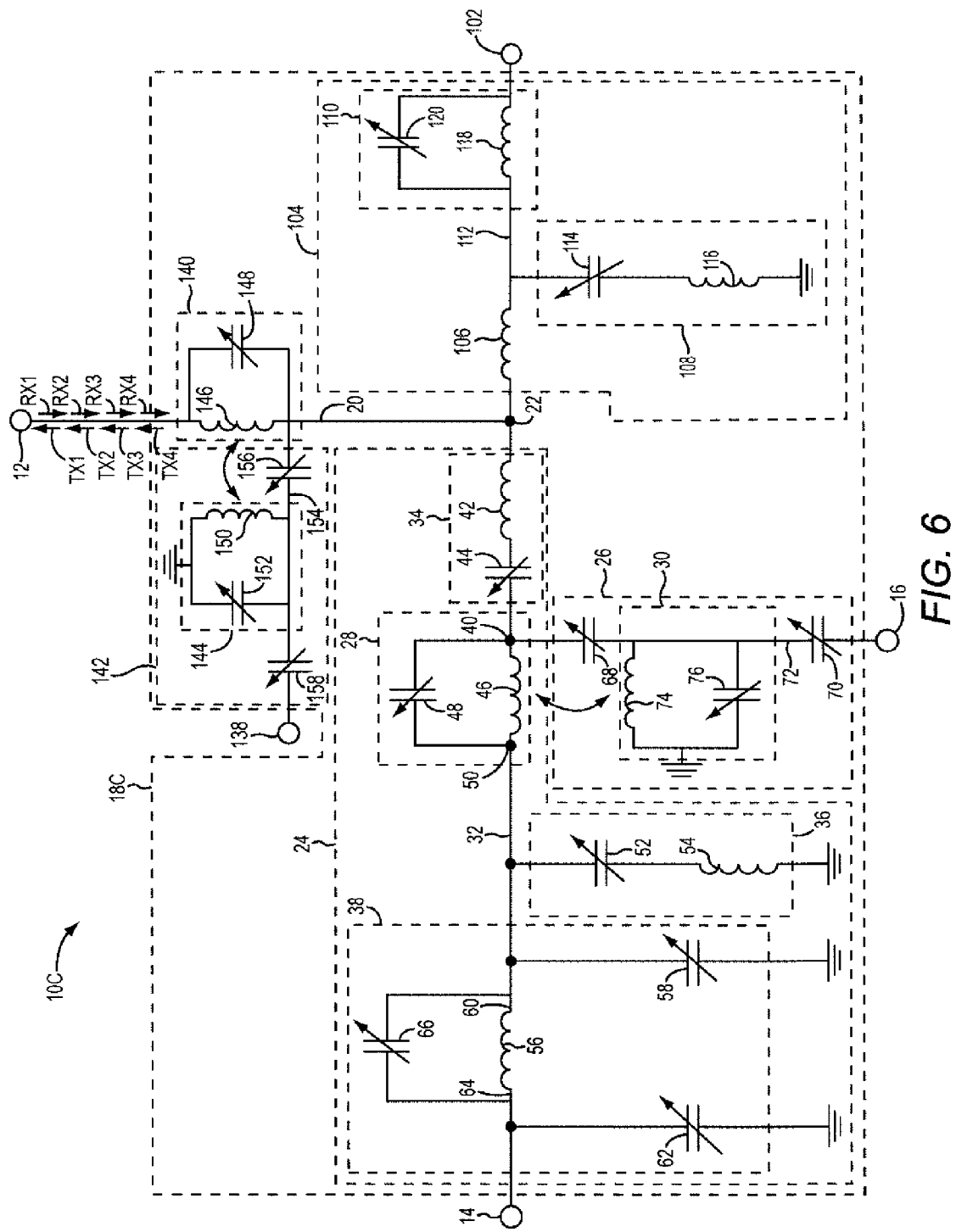
FIG. 6 illustrates another embodiment of multiplexing circuitry that includes the first filter path, the second filter path, a third filter path, and a fourth filter path having a parallel resonant circuit that is weakly coupled to a parallel resonant circuit along a common path.

FIG. 6 illustrates another embodiment of multiplexing circuitry 10C. The multiplexing circuitry 10C shown in FIG. 6 is quadplexing circuitry. The multiplexing circuitry 10C includes the common port 12, the first RF port 14 the second RF port 16, filtering circuitry 18C, and a fourth RF port 138. The filtering circuitry 18C includes the first filter path 24 and the second RF filter path described above with respect to FIG. 1. The filtering circuitry 18C also includes the third filter path 104 described above with respect to FIG. 4. However, in addition, the filtering circuitry 18C is coupled to the fourth RF port 138 so as to provide a fourth transfer function between the common port 12 and the fourth RF port 138.

More specifically, in this embodiment, the filtering circuitry 18C includes a parallel resonant circuit 140 provided in series within the common path 20 and a fourth filter path 142 having a parallel resonant circuit 144. More specifically, the parallel resonant circuit 144 is provided in shunt with respect to the fourth filter path 142 and is weakly coupled to the parallel resonant circuit 140. In this manner, the fourth filter path 142 is operably associated with the common path 20 so that the fourth transfer function between the common port 12 and the fourth RF port 138 defines a fourth passband. The fourth passband may be provided in a different RF frequency band than the RF receive signals RX1, RX2, RX3 and the RF transmission signals TX1, TX2, TX3. For example, an RF receive signal RF4 may be provided in the RF communication band of the fourth passband and thus be routed from the common port 12 to the fourth RF port 138 through the fourth filter path 142. Additionally or alternatively, an RF transmission signal TX4 within the same RF frequency band as the RF receive signal RX4 can be routed from the fourth RF port 138 through the fourth filter path 142 into the common port 12. Since the parallel resonant circuit 144 of the fourth filter path 142 is weakly coupled to the parallel resonant circuit 140 of the common path 20, the first transfer function between the common port 12 and the first RF port 14 defines a stopband within the fourth passband of the fourth transfer function between the common port 12 and the fourth RF port 138. Additionally, since the parallel resonant circuit 144 is weakly coupled to the parallel resonant circuit 140, the third transfer function between the common port 12 and the third RF port 102 also defines a stopband within the fourth passband of the fourth transfer function between the common port 12 and the fourth RF port 138. In this embodiment, the parallel resonant circuit 140 within the common path 20 includes an inductor 146 and a capacitive element 148 connected in parallel with one another. The parallel resonant circuit 144 of the fourth filter path 142 includes an inductor 150 and a capacitive element 152 coupled in parallel with one another and in shunt with respect to a main branch 154 of the fourth filter path 142. In this embodiment, the inductor 150 and the inductor 146 are magnetically coupled to one another. In addition, the fourth filter path 142 includes a capacitive element 156 connected in series within the fourth filter path 142 and between the parallel resonant circuit 140 and the parallel resonant circuit 144. In this manner, the capacitive element 156 is connected so as to electrically couple the parallel resonant circuit 140 and the parallel resonant circuit 144. A capacitive element 158 is provided in series within the fourth filter path 142 and connected between the fourth RF port 138 and the parallel resonant circuit 144. In this embodiment, the capacitive element 158 is a variable capacitive element having a variable capacitance, which can be varied in order to match a port impedance at the fourth RF port 138 with the path impedance of the fourth filter path 142. Additionally, the capacitive element 148 and the capacitive element 152 are also each provided as variable capacitive elements in this embodiment where the variable capacitances of the capacitive elements 148, 152 can be varied in order to transpose the fourth passband 162. Similarly, the capacitive element 156 is provided as a variable capacitive element having a variable capacitance, which can be used to adjust the electric coupling between the parallel resonant circuit 144 and the parallel resonator circuit 140.

Figure 7:
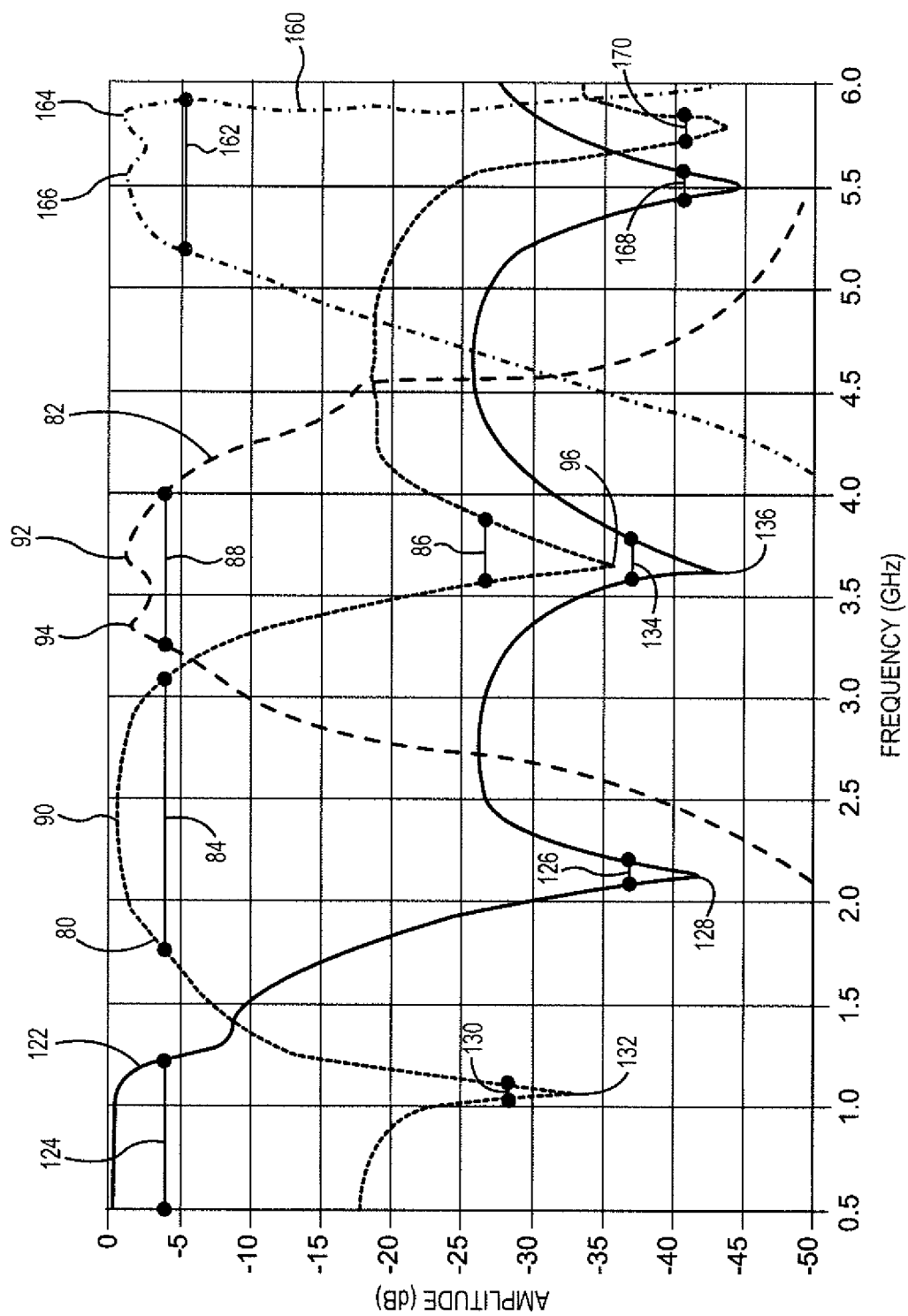
FIG. 7 illustrates a frequency response of the multiplexing circuitry shown in FIG. 6.

Referring now to FIGS. 6 and 7, FIG. 7 illustrates an exemplary frequency response of the multiplexing circuitry 10C shown in FIG. 6. FIG. 7 shows an example of the first transfer function provided between the common port 12 and the first RF port 14, the second transfer function 82 provided between the common port 12 and the second RF port 16, the third transfer function 122 provided between the common port 12 and the third RF port 102, and an example of the fourth transfer function 160 provided between the common port 12 and the fourth RF port 138 by the filtering circuitry 18C shown in FIG. 6. The first transfer function 80 has the first passband 84, the stopband 86, and the stopband 130 provided in the same manner as described above with respect to FIG. 5. The second transfer function 82 has the second passband 88 provided in the same manner as described above with respect to FIG. 5. Also, the third transfer function 122 has the third passband 124, the stopband 126, and the stopband 134 provided in the same manner as described above with respect to FIG. 5. However, the third passband 124 has a high end edge frequency of around 1.3 GHz in FIG. 7 instead of 1.5 GHz as shown in FIG. 5.

The fourth transfer function 160 is tuned to provide a fourth passband 162. The parallel resonant circuit 140 is configured to resonate at a frequency of approximately 5.8 GHz and thus defines a local maxima 164 of the fourth passband 162. The parallel resonant circuit 144 is configured to resonate at a frequency of 5.4 GHz, thereby providing a local maxima 166 in the fourth passband 162. In this case, the fourth passband has a low edge frequency of 5.2 GHz and a high edge frequency of 5.9 GHz. Since the parallel resonant circuit 140 and the parallel resonant circuit 144 are weakly coupled, the first transfer function 80 provided between the common port 12 and the first RF port 14 defines a stopband 168 within the fourth passband 162 of the fourth transfer function 160. Additionally, since the parallel resonant circuit 140 and the parallel resonant circuit 144 are weakly coupled, the third transfer function 122 provided between the common port 12 and the third RF port 102 also defines a stopband 170 within the fourth passband 162 of the fourth transfer function 160. In other words, since the parallel resonant circuits 140, 144 are weakly coupled, the stopbands 168, 170 are automatically provided in the first transfer function 80 and third transfer function 122 without needing to add additional components to the first filter path 24 and the third filter path 104. In the example shown in FIG. 7, the stopband 168 and the stopband 170 are each notches.

FIG. 8 illustrates another exemplary multiplexing circuitry 10D. Like the multiplexing circuitry 10C shown in FIG. 6, the multiplexing circuitry 10D is also a quadplexer. The multiplexing circuitry 10D includes the common port 12, the first RF port 14, the second RF port 16, the third RF port 102, and the fourth RF port 138. The filtering circuitry 18D provided by the multiplexing circuitry 10D includes the first filter path 24 and the second filter path 26 described above with respect to FIG. 1. The filtering circuitry 18D further includes an example of a third filter path 104' that is connected to extend from the connection node 22 to the third RF port. The third filter path 104' shown in FIG. 8 is similar to the third filter path 104 shown in FIG. 4 and includes the inductor 106, the series resonant circuit 108, and the parallel resonant circuit 110 in substantially the same manner as described above with respect to FIG. 4. However, the third filter path 104' further includes the parallel resonant circuit 140 provided in series within the third filter path 104'. More specifically, in this embodiment, the parallel resonant circuit 140 is connected in series within the third RF filter path between the inductor 106 and the series resonant circuit 108. The fourth filter path 142 is the same fourth filter path 142 shown in FIG. 6. Thus, the parallel resonant circuit 144 is provided in shunt with respect to the fourth filter path 142 that is connected to the fourth RF port 138 and extends to connect at connection node 180 to the third filter path 104'. In this manner, the filtering circuitry 18D is coupled to the fourth RF port 138 so as to provide the fourth transfer function between the common port 12 and the fourth RF port 138 where the fourth transfer function has the fourth passband.

Again, the parallel resonant circuit 144 of the fourth filter path 142 is weakly coupled to the parallel resonant circuit 140 of the third filter path 104'. Since the parallel resonant circuit 144 is weakly coupled to the parallel resonant circuit 140, the first transfer function provided between the common port 12 and the first RF port 14 defines a stopband within the fourth passband of the fourth transfer function. Additionally, since the parallel resonant circuit 144 is weakly coupled to the parallel resonant circuit 140, the third transfer function provided by the filtering circuitry 18D between the common port 12 and the third RF port 102 also defines a stopband within the fourth passband of the fourth transfer function between the common port 12 and the fourth RF port 138.

FIG. 9 illustrates an exemplary frequency response of the multiplexing circuitry 10D shown in FIG. 8. In this embodiment, the first passband 84 provided by the first filter path 24 in the first transfer function 80 between the common port 12 and the first RF port 14 is provided substantially in the same manner as described above with respect to FIGS. 5 and 7. Similarly, the second passband 88 provided by the second transfer function 82 between the common port 12 and the second RF port 16 is provided in the same manner described above with respect to FIGS. 5 and 7. The first transfer function also includes the stopband 86 and the third transfer function 122 also includes the stopband 134 in a substantially similar manner as described above with respect to FIGS. 5 and 7. Additionally, the third passband 124 of the third filter path 104' is provided in the same manner described above with respect to FIG. 1. However, in this embodiment, the fourth passband 162 of the fourth transfer function 160 is provided to have a low edge frequency 1.3 GHz while the high edge frequency of the fourth passband 162 is provided at approximately 1.6 GHz. The parallel resonant circuit 144 is tuned to resonate at a frequency of approximately 1.55 GHz and thus the local maxima 164 of the fourth passband 162 is provided at this frequency. Similarly, the parallel resonant circuit 140 is configured to resonate at a frequency of approximately 1.3 GHz and thus the local maxima 166 of the fourth passband 162 is provided at this frequency. Since the parallel resonant circuit 144 of the fourth filter path 142 is weakly coupled with the parallel resonant circuit 140 within the third filter path 104', the first transfer function 80 defines the stopband 170 within the fourth passband 162 of the fourth transfer function 160. In this example, the stopband 170 is a notch. Additionally, since the parallel resonant circuit 140 is weakly coupled to the parallel resonant circuit 144, the third transfer function 122 defines the stopband 168 within the fourth passband 162 of the fourth transfer function 160. In this example, the stopband 168 is rippled and has a local minima 172 and a local minima 174. This may result from the resonant frequencies of the parallel resonant circuit 140 and the parallel resonant circuit 144 along with the coupling factor between the parallel resonant circuit 140 and the parallel resonant circuit 144. Adjusting the variable capacitance of the capacitive element 156 of the fourth filter path 142 so as to lower the coupling factor may bring the local minima 172 and the local minima 174 closer and closer together until they merge and simply form a notch.

FIG. 10 illustrates another embodiment of the multiplexing circuitry 10E. The multiplexing circuitry 10E shown in FIG. 10 is also quadplexing circuitry. The multiplexing circuitry 10E shown in FIG. 10 includes the common port 12, the first RF port 14, the second RF port 16, the third RF port 102, the fourth RF port 138, and filtering circuitry 18E that is coupled to each of the ports 12, 14, 16, 102, 138. The filtering circuitry 18E includes a first filter path 24', the second filter path 26 (provided in the same manner as described above with respect to FIG. 1), the third filter path 104 (provided in the same manner as described above with respect to FIG. 4), and the fourth filter path 142. The filtering circuitry 18E is coupled to the fourth RF port 138 so as to provide the fourth transfer function between the common port 12 and the fourth RF port 138. As with the previous embodiments described above, the fourth transfer function has the fourth passband 162.

Additionally, the first filter path 24' shown in FIG. 10 is configured to provide the first passband in the first transfer function defined between the common port 12 and the first RF port 14, just like the first filter path 24 shown in FIGS. 1, 4, 6, and 8. The first filter path 24' shown in FIG. 10 is similar to the first filter path 24 shown in FIGS. 1, 4, 6, 8, and includes the series resonant circuit 34, the parallel resonant circuit 28, the series resonant circuit 36, and the matching network 38, just like the first filter path 24 shown in FIGS. 1, 4, 6, 8. However, in this embodiment, the first filter path 24' further includes the parallel resonant circuit 140. More specifically, the parallel resonant circuit 140 is provided in series in the first filter path 24'. In this embodiment, the parallel resonant circuit 140 is connected in series between the series resonant circuit 34 and the parallel resonant circuit 28. The fourth filter path 142 in the embodiment shown in FIG. 10 is connected at a connection node 180 so that the capacitive element 156 electrically couples the parallel resonant circuit 140 and the parallel resonant circuit 144. With the parallel resonant circuit 140 and the parallel resonant circuit 144, the filtering circuitry 18E is configured to define the fourth passband within the fourth transfer function between the common port 12 and the fourth RF port 138. Furthermore, since the parallel resonant circuit 144 is weakly coupled to the parallel resonant circuit 140, the first transfer function 80 between the common port 12 and the first RF port 14 defines the stopband within the fourth passband 162. Additionally, since the parallel resonant circuit 144 is weakly coupled to the parallel resonant circuit 140, the third transfer function between the common port 12 and the third RF port 102 defines another stopband within the fourth passband 162.

Referring now to FIGS. 10 and 11, FIG. 11 illustrates an exemplary frequency response of the multiplexing circuitry 10E shown in FIG. 10. FIG. 11 shows an example of the first transfer function 80 provided between the common port 12 and the first RF port 14, the second transfer function 82 provided between the common port 12 and the second RF port 16, the third transfer function 122 provided between the common port 12 and the third RF port 102, and an example of the fourth transfer function 160 provided between the common port 12 and the fourth RF port 138 by the filtering circuitry 18E shown in FIG. 10. The first transfer function 80 has the first passband 84, the stopband 86, and the stopband 130 provided in substantially the same manner as described above with respect to FIG. 5. The second transfer function 82 also has the second passband 88 provided in substantially the same manner as described above with respect to FIG. 5. Furthermore, the third transfer function 122 has the third passband 124, the stopband 126, and the stopband 134 provided in the same manner as described above with respect to FIG. 5. However, the third passband 124 has a high end edge frequency of around 1.3 GHz in FIG. 11 instead of 1.5 GHz as shown in FIG. 5.

The fourth transfer function 160 is tuned to provide a fourth passband 162. The parallel resonant circuit 140 is configured to resonate at a frequency of approximately 5.8 GHz and thus defines a local maxima 164 of the fourth passband 162. The parallel resonant circuit 144 is configured to resonate at a frequency of 5.4 GHz, thereby providing the local maxima 166 in the fourth passband 162. In this case, the fourth passband has a low edge frequency of 5.2 GHz and a high edge frequency of 5.9 GHz. Since the parallel resonant circuit 140 and the parallel resonant circuit 144 are weakly coupled, the first transfer function 80 provided between the common port 12 and the first RF port 14 defines the stopband 168 within the fourth passband 162 of the fourth transfer function 160. Additionally, since the parallel resonant circuit 140 and the parallel resonant circuit 144 are weakly coupled, the third transfer function 122 provided between the common port 12 and the third RF port 102 also defines the stopband 170 within the fourth passband 162 of the fourth transfer function 160. In other words, since the parallel resonant circuits 140, 144 are weakly coupled, the stopbands 168, 170 are automatically provided in the first transfer function 80 and third transfer function 122 without needing to add additional components to the first filter path 24' and the third filter path 104. In the example shown in FIG. 11, the stopband 168 and the stopband 170 are each notches.

FIG. 12 illustrates another embodiment of multiplexing circuitry 10F. The multiplexing circuitry 1OF shown in FIG. 12 is a triplexer. The multiplexing circuitry 1OF includes the common port 12, the first RF port 14, the second RF port 16, and the third RF port 102. Furthermore the multiplexing circuitry 1OF includes filtering circuitry 18F coupled to the common port 12, the first RF port 14, the second RF port 16, and the third RF port 102. The filtering circuitry is configured to provide a first transfer function between the common port 12 and the first RF port 14, a second transfer function between the common port 12 and the second RF port 16, and a third transfer function between the common port 12 and the third RF port 102. In this embodiment, the filtering circuitry 18F includes a first filter path 24" connected between the common port 12 and the first RF port 14, a second filter path 26' connected between the common port 12 and the second RF port 16, and a third filter path 104' connected between the common port 12 and the third RF port 102. More specifically, in this embodiment, the first filter path 24" branches from the common path 20 so as to extend from the connection node 22 to the first RF port 14. As discussed above, the common path 20 is connected between the common port 12 and the connection node 22. Furthermore, the third filter path 104" branches from the common path 20 so as to extend from the connection node 22 to the third RF port. In the embodiment illustrated in FIG. 12, the second filter path 26' is connected to the common path 20 such that the second filter path 26' extends from the common path 20 to the second RF port 16. The first filter path 24" is provided such that the first transfer function between the common port 12 and the first RF port 14 has a first passband. In this embodiment, the first filter path 24" includes a parallel resonant circuit 190 coupled in shunt with respect to the first filter path 24'. The parallel resonant circuit 190 includes an inductor 192 and a capacitive element 194 connected in parallel. However, as shown in FIG. 12, the inductor 192 is center tapped to ground. As such, the capacitive element 194 and the lower part of the inductor 192 are connected in series with respect to ground and thus provide a series resonance that can be utilized to create a notch in the first frequency response. Additionally, the first filter path 24" includes a capacitive element 195. The capacitive element 195 is connected to the common path 20 at the connection node 22 and in series within the first filter path 24" between the common path 20 and the parallel resonant circuit 190. In this embodiment, the capacitive element 194 and the capacitive element 195 are each variable capacitive elements that each have a variable capacitance. To transpose the first passband of the first transfer function, the variable capacitances of the capacitive elements 194 and 195 may be adjusted.

The third filter path 104" includes a parallel resonant circuit 196 coupled in shunt with respect to the third filter path 104". While the second transfer function provided between the common port 12 and the second RF port 16 has a second passband which is provided by the second filter path 26', the third RF filter path provides the third transfer function between the common port 12 and the third RF port 102 so that the third transfer function has a third passband. The third passband is provided by the parallel resonant circuit 196. The parallel resonant circuit 196 includes an inductor 198 and a capacitive element 200 connected in parallel. Furthermore, the inductor 198 is center tapped to ground. In this manner, the capacitive element 200 and the lower half of the inductor 198 provide a series resonance that can be utilized to provide a notch. The third filter path 104" also includes a capacitive element 202 that is connected to the common path 20 in a series within the third filter path 104" between the common path 20 and the parallel resonant circuit 196. The capacitive element 200 and the capacitive element 200 are each variable capacitive elements, and each have a variable capacitance. To transpose the third passband provided in the third transfer function by the third filter path 104", the variable capacitances of the capacitive elements 200 and 202 can be adjusted. As mentioned above, the second filter path 26' is configured to provide the second transfer function between the common port 12 and the second RF port 16 so that the second transfer function has the second passband. In this embodiment, the second filter path includes a parallel resonant circuit 204 that is provided in shunt with respect to the second filter path 26' and a parallel resonant circuit 206 that is also provided in shunt with respect to the second filter path 26'. The parallel resonant circuit 206 is weakly coupled to the parallel resonant circuit 204. Thus, in accordance with the resonant frequencies of the parallel resonant circuits 204, 206, the second filter path 26' provides the second passband within the second transfer function. However, since the parallel resonant circuit 206 is weakly coupled to the parallel resonant circuit 204, the first transfer function defined between the common port 12 and the first RF port 14 has a stopband wherein the stopband is within the second passband of the second transfer function defined between the common port 12 and second RF port 16. Furthermore, since the parallel resonant circuit 206 is weakly coupled to the parallel resonant circuit 204, the third transfer function defined between the common port 12 and the third RF port 102 also has a stopband that is within the second passband of the second transfer function defined between the common port 12 and the second RF port 16. Thus, by providing the parallel resonant circuit 204 and the parallel resonant circuit 206 in the second filter path 26' so that the parallel resonant circuit 204 and the parallel resonant circuit 206 are weakly coupled to each other, the weak coupling between the parallel resonant circuit 204, 206 automatically provides stopbands in the first transfer function and the third transfer function within the second passband provided by the second filter path 26'. In this embodiment, the parallel resonant circuit 204 includes an inductor 208 and a capacitive element 210 connected in parallel. In addition, the parallel resonant circuit 206 includes an inductor 212 and a capacitive element 214. The inductor 208 is magnetically coupled to the inductor 212 in order to weakly couple the parallel resonant circuit 204 with the parallel resonant circuit 206. In this embodiment, the parallel resonant circuit 204 and the parallel resonant circuit 206 are not electrically coupled to one another so that the coupling factor does not include an electric coupling factor and just a magnetic coupling factor.

Alternatively, in other embodiments, a capacitive element, and in particular a variable capacitive element may be provided between the parallel resonant circuit 204 and the parallel resonant circuit 206 to provide electric coupling. Furthermore, the coupling factor between the parallel resonant circuit 204 and the parallel resonant circuit 206 can be adjusted by varying the variable capacitance of this capacitive element.

Referring again to the second filter path 26' shown in FIG. 12, the second filter path 26' includes a variable capacitive element 216 having a variable capacitance. The variable capacitive element 216 is provided in series within the second filter path 26' and is connected to the second RF port 16. More specifically, the variable capacitive element 216 is connected between the parallel resonant circuit 206 and the second RF port 16. The variable capacitive element is tunable so as to match a port impedance of the second RF port 16 with a path impedance of the second filter path 26'. The second filter path 26' also includes a variable capacitive element 218 having a variable capacitance. The variable capacitive element 218 is connected to the common path 20 and in series within the second filter path 26' between the common path 20 and the parallel resonant circuit 204.

Referring now to FIGS. 12 and 13, FIG. 13 illustrates a frequency response of the multiplexing circuitry 1 OF shown in FIG. 12. More specifically, FIG. 13 illustrates the first transfer function 80 defined between the common port 12 and the first RF port 14, the second transfer function 82 defined between the common port 12 and the second RF port 16, and the third transfer function 122 defined between the common port 12 and the third RF port 102. In particular, the frequency response is shown as the second passband 88 defined in the second transfer function is transposed to different frequency ranges. More specifically, the second transfer function 82(1) is a transfer function 82 with the second passband 88 provided as the second passband 88(1) where the second passband 88(1) has a low edge frequency of 1.7 GHz and a high edge frequency of 1.8 GHz. The second transfer function 82(2) is the second transfer function 82 when the second passband 88 is provided as the second passband 88(2). The second passband 88(2) is the second passband 88 with a low edge frequency 1.7 GHz and a high edge frequency of 1.9 GHz. The second transfer function 82(3) is the second transfer function 82 when the second passband 88 is provided as the second passband 88(3). In this case, the second passband 88(3) has a low edge frequency of 1.9 GHz and a high edge frequency of 2 GHz. FIG. 13 also illustrates the first transfer function 80 having the first passband 84 having a low edge frequency of approximately 2.5 GHz and a high edge frequency of approximately 2.7 GHz. The third transfer function 122 provides the third passband 124 with a low edge frequency of approximately 2.05 GHz and a high edge frequency of about 2.15 GHz. As shown in FIG. 13, the first frequency response has the stopband 86, which is provided by the weak coupling of the parallel resonant circuit 204 and the parallel resonant circuit 206 in the second filter path 26'. More specifically, the filtering circuitry 18F is tunable such that transposing the second passband 88 to a different frequency range also transposes the stopband 86 to the different frequency range, and in this manner, the stopband 86 is maintained within the second passband 88. More specifically, as show in FIG. 13, the stopband 86(1) is the stopband 86 when the second passband 88 is provided as the second passband 88(1). The stopband 86(2) is the stopband 86 when the second passband 88 is provided as the second passband 88(2). The stopband 86(2) is within the second passband 88(2). The stopband 86(3) is the stopband 86 when the second passband 88 is provided as the second passband 88(3). The stopband 86(3) is within the second passband 88(3).

The filtering circuitry 18F shown in FIG. 12 is also tunable such that transposing the second passband 88 to a different frequency range also transposes the stopband 134 within the different frequency range. In this manner, the stopband 134 provided by the weak coupling between the parallel resonant circuit 204 and the parallel resonant circuit 206 within the second filter path 26' also is maintained within the second passband 88. Thus, as shown in FIG. 13, the stopband 134(1) is the stopband 134 when the second passband 88 is provided as the second passband 88(1). The stopband 134(1) is within the second passband 88(1). The stopband 134(2) is the stopband 134 when the second passband 88 is provided as the second passband 88(2). The stopband 86(2) is within the second passband 88(2). The stopband 134(3) is the stopband 134 when the second passband 88 is provided as the second passband 88(3). The stopband 134(3) is within the second passband 88(3).

Also, as shown in FIG. 13, the first passband has a stopband 130 (in this case, a notch) within the third passband 124 of the third transfer function 122. The stopband 130 is provided by the series resonance of the lower half of the inductor 192 and the capacitive element 194. Additionally, the third transfer function 122 has a stopband 126 that is within the first passband 84. The stopband 126 is created by the lower half of the inductor 198 and the capacitive element 200 operating with series resonance.

FIGS. 13A-13C illustrate different implementations for coupling the second filter path 26' in FIG. 12 to another path, such as the common path 20. While coupling is specifically provided to the common path 20 in FIGS. 13A-13C, it should be noted that the illustrated techniques can be utilized to couple the second filter path 26' to any other filter path.

In FIG. 13A, the second filter path 26' is the same as the embodiment shown in FIG. 12 where the capacitive element 218 capacitively couples the second filter path 26' to the common path 20.

In FIG. 13B, the second filter path 26' of FIG. 13B is the same as the second filter path 26' shown in FIG. 12, except that the second filter path 26' is doubly capacitively coupled with the capacitive element 218 and another capacitive element NOD. The capacitive element NOD is connected between the common path 20 and the parallel resonator 206. The capacitive element NOD provides an additional notch filter that widens the bandwidth of the passband of the second filter path 26' and increases isolation with the common path 20.

In FIG. 13C, the second filter path 26' is magnetically coupled to the common path 20. The second filter path 26' of FIG. 13C is the same as the second filter path 26' shown in FIG. 12, except that the capacitive element 218 is not provided. Furthermore, the common path 20 is the same as the common path 20 shown in FIG. 1, except that the common path 20 includes a series connected inductor INL that is weakly magnetically coupled to the inductor 208 of the parallel resonator 204. Thus, the second filter path 26' is coupled to the common path 20 through magnetic coupling. In an alternate embodiment, a feedforward capacitive element may be added to generate an additional notch and capacitive coupling may be used between the inductor INL and the inductor 208.

FIG. 14 illustrates another embodiment of multiplexing circuitry 10G. The multiplexing circuitry 10G is a quadplexer. The multiplexing circuitry 10G includes the common port 12, the first RF port 14, the second RF port 16, the third RF port 102, and the fourth RF port 138. In addition, the multiplexing circuitry 10G includes filtering circuitry 18G coupled to the common port 12, the first RF port 14, the second RF port 16, the third RF port 102, and the fourth RF port 138. In this embodiment, the filtering circuitry 18G includes the first filter path 24, which is the same as the first filter path 24 described in FIG. 1, the second filter path 26, which is the same as the second filter path 26 described above with respect to FIG. 1, the third filter path 104, which is the same embodiment of the third filter path 104 as described above with respect to FIG. 4, and the fourth filter path 142'. In this embodiment, the fourth filter path 142' branches from the common path 20 so as to extend from the connection node 22 to the fourth RF port 138. The fourth filter path 142' includes a parallel resonant circuit 220 and a parallel resonant circuit 222. The parallel resonant circuit 220 is coupled in shunt with respect to the fourth filter path 142'.

In addition, the parallel resonant circuit 222 is coupled in shunt with respect to the fourth filter path 142'. Furthermore, the parallel resonant circuit 222 is weakly coupled to the parallel resonant circuit 220. In this manner, the fourth filter path 142 defines the fourth passband between the common port 12 and the fourth RF port 138. However, since the parallel resonant circuit 222 is weakly coupled to the parallel resonant circuit 220, the first transfer function between the common port 12 and the first RF port 14 has a stopband within the fourth passband. Additionally, the third transfer function defined between the common port 12 and the third RF port 102 includes a stopband within the fourth passband of the fourth transfer function. In this embodiment, the parallel resonant circuit 220 includes an inductor 224, a variable capacitive element 226, and a variable capacitive element 228. The variable capacitive elements 226 and 228 are connected at the connection node 229. Furthermore, the inductor 224 and the variable capacitive element 228 are grounded. To couple the parallel resonant circuit 220 to a main branch 230 of the fourth filter path 142', a series resonant circuit 232 is connected from connection node 234 in the main branch 230 and the connection node 229 between the variable capacitive elements 226, 228. The series resonant circuit 232 includes a variable capacitive element 236 and an inductor 238 connected in series with one another. The series resonant circuit 232 is used to provide narrow-band coupling for the weakly coupled resonators 220, 222 and thus helps ensure minimal out of band loading.

Also, since the inductor 224 and the variable capacitive element 226 appear to ground to be in series, another stopband (e.g., a notch) can be provided in the fourth stopband. The parallel resonant circuit 222 includes an inductor 238 and a variable capacitive element 242 that are connected in parallel with one another and in shunt to the main branch 230 of the fourth filter path 142'. In this embodiment, the inductor 238 and the inductor 224 are magnetically coupled to one another. In addition, a variable capacitive element 244 is connected within the main branch 230 and between the connection node 234 and the parallel resonant circuit 222 so as to electrically couple the parallel resonant circuit 220 and the parallel resonant circuit 222. By adjusting a variable capacitance of the variable capacitive element 226, the coupling factor between the parallel resonant circuit 220 and the parallel resonant circuit 222 can be adjusted. The fourth filter path 142' also includes a variable capacitive element 246 having a variable capacitance. The variable capacitive element 246 is provided in series within the fourth filter path 142' and is connected to the fourth RF port 138. More specifically, the variable capacitive element 226 is connected between the parallel resonant circuit 222 and the fourth RF port 138. By adjusting the variable capacitance of the variable capacitive element 246, the variable capacitive element 246 is tunable so as to match a port impedance of the fourth RF port 138 with a path impedance of the fourth filter path 142'. The fourth filter path 142' is connected to the connection node 22 by a resistor 248 and a capacitive element 250 coupled in parallel with one another and between the connection node 22 and the connection node 234.

FIG. 15 illustrates an exemplary frequency response of the multiplexing circuitry 10G shown in FIG. 14. In this embodiment, the first passband 84 provided by the first filter path 24 in the first transfer function 80 between the common port 12 and the first RF port 14 is provided substantially in the same manner as described above with respect to FIG. 5. Similarly, the second passband 88 provided by the second transfer function 82 between the common port 12 and the second RF port 16 is provided in the same manner described above with respect to FIGS. 5 and 7. The first transfer function also includes the stopband 86 and the third transfer function 122 also includes the stopband 134 in a substantially similar manner as described above with respect to FIG. 5. Additionally, the third passband 124 of the third filter path 104 is provided in the same manner described above with respect to FIG. 1. However, in this embodiment, the fourth passband 162 of the fourth transfer function 160 is provided to have a low edge frequency 1.3 GHz while the high edge frequency of the fourth passband 162 is provided at approximately 1.6 GHz. The parallel resonant circuit 222 is tuned to resonate at a frequency of approximately 1.55 GHz and thus the local maxima 164 of the fourth passband 162 is provided at this frequency. Similarly, the parallel resonant circuit 220 is configured to resonate at a frequency of approximately 1.3 GHz and thus the local maxima 166 of the fourth passband 162 is provided at this frequency. Since the parallel resonant circuit 222 is weakly coupled with the parallel resonant circuit 220 within the fourth filter path 142', the first transfer function 80 defines the stopband 170 within the fourth passband 162 of the fourth transfer function 160. In this example, the stopband 170 is a notch. Additionally, since the parallel resonant circuit 220 is weakly coupled to the parallel resonant circuit 222, the third transfer function 122 defines the stopband 168 within the fourth passband 162 of the fourth transfer function 160. In this example, the stopband 168 is rippled and has the local minima 172 and the local minima 174. This may result from the resonant frequencies of the parallel resonant circuit 220 and the parallel resonant circuit 222 along with the coupling factor between the parallel resonant circuit 220 and the parallel resonant circuit 222. Adjusting the variable capacitance of the capacitive element 156 of the fourth filter path 142' so as to lower the coupling factor may bring the local minima 172 and the local minima 174 closer and closer together until they merge and simply form a notch.

Those skilled in the art will recognize improvements and modifications to the preferred embodiments of the present disclosure. All such improvements and modifications are considered within the scope of the concepts disclosed herein and the claims that follow.

What is claimed is:

1. Multiplexing circuitry comprising:
   a common port, a first port, and a second port;
   filtering circuitry coupled to the common port, the first port, and the second port and configured to provide a first transfer function between the common port and the first port and a second transfer function between the common port and the second port wherein:
  the first transfer function has a first passband and a first stopband;
  the second transfer function has a second passband wherein the first stopband of the first transfer function is within the second passband;
  a first filter path connected between the common port and the first port;
  a first parallel resonant circuit is provided in shunt with respect to a second filter path connected between the common port and the second port; and
  a second parallel resonant circuit is provided in shunt with respect to the second filter path wherein the second parallel resonant circuit is weakly coupled to the first parallel resonant circuit such that the first stopband is within the second passband.

2. The multiplexing circuitry of claim 1 wherein:
  the first parallel resonant circuit comprises a first inductor and a first capacitive element connected in parallel; and
  the second parallel resonant circuit comprises a second inductor and a second capacitive element wherein the second inductor is coupled in parallel with the second capacitive element.

3. The multiplexing circuitry of claim 2 wherein the first inductor is magnetically coupled to the second inductor.

4. The multiplexing circuitry of claim 1 wherein the filtering circuitry further comprises a variable capacitive element having a variable capacitance and wherein:
  the variable capacitive element is provided in series within the second filter path and is connected to the second port; and
  the variable capacitive element is tunable so as to match a port impedance of the second port with a path impedance of the second filter path.

5. The multiplexing circuitry of claim 1 wherein the filtering circuitry further comprises a third parallel resonant circuit coupled in shunt with respect to the first filter path.

6. The multiplexing circuitry of claim 5 wherein the third parallel resonant circuit comprises a first inductor and a first capacitive element connected in parallel wherein the first inductor is center tapped to ground.

7. The multiplexing circuitry of claim 1 further comprising a third port wherein the filtering circuitry further comprises a third filter path connected to the third port wherein the filtering circuitry is further configured to provide a third transfer function between the common port and the third port and the third filter path is configured to provide a third passband in the third transfer function.

8. The multiplexing circuitry of claim 7 wherein the second parallel resonant circuit is weakly coupled to the first parallel resonant circuit such that the third transfer response defines a second stopband within the second passband.

9. The multiplexing circuitry of claim 8 wherein the filtering circuitry comprises a common path connected between the common port and a connection node wherein:
  the first filter path branches from the common path so as to extend from the connection node to the first port; and
  the third filter path branches from the common path so as to extend from the connection node to the third port.

10. The multiplexing circuitry of claim 9 wherein the second filter path is connected to the common path such that the second filter path extends from the common path to the second port.

11. The multiplexing circuitry of claim 10 wherein the filtering circuitry further comprises a capacitive element connected to the common path and in series within the second filter path between the common path and the first parallel resonant circuit.

12. The multiplexing circuitry of claim 10 wherein the filtering circuitry further comprises a third parallel resonant circuit coupled in shunt with respect to the first filter path and a fourth parallel resonant circuit coupled in shunt with respect to the third filter path, wherein:
  the third parallel resonant circuit comprises a first inductor and a first capacitive element connected in parallel wherein the first inductor is center tapped to ground; and
  the fourth parallel resonant circuit comprises a second inductor and a second capacitive element connected in parallel wherein the second inductor is center tapped to ground.

13. The multiplexing circuitry of claim 12 wherein the filtering circuitry further comprises a third capacitive element and a fourth capacitive element wherein:
  the third capacitive element is connected to the common path and in series within the first filter path between the common path and the third parallel resonant circuit; and
  the fourth capacitive element is connected to the common path and in series within the third filter path between the common path and the fourth parallel resonant circuit.

14. The multiplexing circuitry of claim 1 wherein the filtering circuitry is tunable such that transposing the second passband to a different frequency range also transposes the first stopband within the different frequency range.

15. The multiplexing circuitry of claim 1 wherein the filtering circuitry comprises a common path connected between the common port and a connection node wherein:
  the first filter path branches from the common path so as to extend from the connection node to the first port; and
  the second filter path branches from the common path so as to extend from the connection node to the second port.

16. The multiplexing circuitry of claim 15 further comprising a third port wherein the filtering circuitry further comprises a third filter path that branches from the common path so as to extend from the connection node to the third port, wherein the filtering circuitry is further configured to provide a third transfer function between the common port and the third port and the third filter path is configured to provide a third passband in the third transfer function and wherein the second parallel resonant circuit is weakly coupled to the first parallel resonant circuit such that the third transfer response defines a second stopband within the second passband.

17. The multiplexing circuitry of claim 16 further comprising a fourth port wherein the filtering circuitry is coupled to the fourth port so as to provide a fourth transfer function between the common port and the fourth port and wherein:
  the fourth transfer function has a fourth passband;
  a third parallel resonant circuit is provided in series in the first filter path; and
  a fourth parallel resonant circuit is provided in shunt with respect to a fourth filter path that is connected to the fourth port, wherein the fourth parallel resonant circuit is weakly coupled to the third parallel resonant circuit such that the first transfer function defines a third stopband within the fourth passband and the third transfer function defines a fourth stopband within the fourth passband.

18. The multiplexing circuitry of claim 1 further comprising a third port wherein the filtering circuitry is coupled to the third port so as to provide a third transfer function between the common port and the third port and wherein:
- the third transfer function has a third passband;
- a third parallel resonant circuit is provided in series in the first filter path; and
- a fourth parallel resonant circuit is provided in shunt with respect to a third filter path that is connected to the third port, wherein the fourth parallel resonant circuit is weakly coupled to the third parallel resonant circuit such that the first transfer function defines a second stopband within the third passband and the third transfer function defines a fourth stopband within the third passband.

19. The multiplexing circuitry of claim 18 wherein:
- the third parallel resonant circuit comprises a first inductor and a first capacitive element connected in parallel; and
- the fourth parallel resonant circuit comprises a second inductor and a second capacitive element wherein the second inductor is coupled in parallel with the second capacitive element and the first inductor is magnetically coupled to the second inductor.

20. The multiplexing circuitry of claim 18 wherein the filtering circuitry further comprises a capacitive element connected between the first parallel resonant circuit and the second parallel resonant circuit so as to electrically couple the first parallel resonant circuit to the second parallel resonant circuit.

* * * * *

UNITED STATES PATENT AND TRADEMARK OFFICE
CERTIFICATE OF CORRECTION

PATENT NO. : 9,870,855 B2  
APPLICATION NO. : 14/927565  
DATED : January 16, 2018  
INVENTOR(S) : Dirk Robert Walter Leipold et al.

Page 1 of 1

It is certified that error appears in the above-identified patent and that said Letters Patent is hereby corrected as shown below:

In the Specification

In Column 6, Line 9, replace "Figure1 B" with --FIG. 1B--.

In Column 23, Lines 18, 19, and 22, replace "circuitry 1 OF" with --circuitry 10F--.

In Column 25, Line 25, replace "circuitry 1 OF" with --circuitry 10F--.

Signed and Sealed this  
Tenth Day of April, 2018

Andrei Iancu  
*Director of the United States Patent and Trademark Office*